US012155332B2

(12) United States Patent
Heckroth et al.

(10) Patent No.: US 12,155,332 B2
(45) Date of Patent: Nov. 26, 2024

(54) UPDATING CONTROL PARAMETERS OF A GATE DRIVER DURING OPERATION

(71) Applicant: Skyworks Solutions, Inc., Irvine, CA (US)

(72) Inventors: James E. Heckroth, Austin, TX (US); Ion C. Tesu, Austin, TX (US); John N. Wilson, Austin, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 823 days.

(21) Appl. No.: 17/219,321

(22) Filed: Mar. 31, 2021

(65) Prior Publication Data
US 2022/0182004 A1   Jun. 9, 2022

Related U.S. Application Data

(60) Provisional application No. 63/121,949, filed on Dec. 6, 2020.

(51) Int. Cl.
*H02P 27/08* (2006.01)
*H02P 3/18* (2006.01)
*H03K 17/14* (2006.01)

(52) U.S. Cl.
CPC .............. *H02P 27/085* (2013.01); *H02P 3/18* (2013.01); *H03K 17/145* (2013.01)

(58) Field of Classification Search
CPC .......... H02P 27/085; H02P 3/18; H02P 27/08; H03K 17/145; H03K 17/08128;
(Continued)

(56) References Cited

U.S. PATENT DOCUMENTS 6,097,582 A   8/2000   John
6,271,709 B1  8/2001   Kimura et al.
(Continued)

FOREIGN PATENT DOCUMENTS

CN    109687693 A     4/2019
JP    2020057903 A    4/2020
WO    2018-216261 A1  11/2018

OTHER PUBLICATIONS

Broadcom, "Data Sheet ACPL-352J 5.0 Amp Output Current IGBT and SiC/GaNMOSFET Gate Drive Optocoupler with Integrated Overcurrent Sensing, Fault, Gate, and UVLO Status Feedback," May 15, 2020, 29 pages.
(Continued)

*Primary Examiner* — Charles R Kasenge
(74) *Attorney, Agent, or Firm* — Knobbe, Martens, Olson & Bear, LLP

(57) ABSTRACT

A gate driver includes a variable strength driver circuit that provides an output signal to drive a high power device. The gate driver receives an update request from a host controller during an operating mode in which switching operations occur and updates one or more operating parameters associated with driving the high power device. The operating parameters including turn-on parameters, turn-off parameters, and soft shutdown parameters. The variable strength driver circuit uses the turn-on parameters for turn-on phases for the output signal, uses the turn-off parameters for turn-off phases for the output signal, and uses the soft shutdown parameters for soft shutdown phases for the output signal. The update request adjusts current, voltage, and/or time for one or more phases of the turn-on, turn-off and/or soft shutdown parameters.

21 Claims, 15 Drawing Sheets

(58) Field of Classification Search
CPC ............... H03K 17/163; H03K 17/168; H03K 17/0828; H02M 1/0029; H02M 1/0012; H02M 1/08; H02M 1/32; H02M 1/36; H02M 1/0054; H02M 1/44; H02M 7/53871

See application file for complete search history.

(56) References Cited

U.S. PATENT DOCUMENTS

| | | | |
|---|---|---|---|
| 6,473,280 | B1 | 10/2002 | Buxton |
| 6,545,513 | B2 | 4/2003 | Tsuchida et al. |
| 6,717,785 | B2 | 4/2004 | Fukuda et al. |
| 6,967,519 | B2 | 11/2005 | Nakayama et al. |
| 7,180,337 | B2 | 2/2007 | Feldtkeller |
| 7,948,277 | B2 | 5/2011 | Nakatake |
| 7,978,453 | B2 | 7/2011 | Sharaa |
| 8,213,192 | B2 | 7/2012 | Konecny et al. |
| 8,237,376 | B2 | 8/2012 | Franco |
| 8,362,800 | B2 | 1/2013 | Or-Bach |
| 8,405,373 | B2 | 3/2013 | Tsai et al. |
| 8,350,601 | B2 | 8/2013 | Nagata et al. |
| 8,723,590 | B2 | 5/2014 | Curbelo et al. |
| 8,985,850 | B1 | 3/2015 | Godbole et al. |
| 9,054,621 | B2 | 6/2015 | Liu |
| 9,166,499 | B2 | 10/2015 | Suzuki |
| 9,184,743 | B2 | 11/2015 | Shimizu |
| 9,294,019 | B2 | 3/2016 | Liu |
| 9,374,028 | B2 | 6/2016 | Nondahl |
| 9,425,786 | B2 | 8/2016 | Zoels et al. |
| 9,455,566 | B2 | 9/2016 | Hiyama |
| 9,467,138 | B2 | 10/2016 | Osanai |
| 9,490,738 | B2 | 11/2016 | Nondahl |
| 9,608,623 | B1 | 3/2017 | Kandah |
| 9,698,654 | B2 | 7/2017 | Santos et al. |
| 9,793,890 | B2 | 10/2017 | Kirchner et al. |
| 9,979,292 | B2 | 5/2018 | Zhang et al. |
| 9,998,110 | B2 | 6/2018 | Zojer |
| 10,038,434 | B2 | 7/2018 | Volke |
| 10,211,824 | B2 | 2/2019 | Tsurumaru |
| 10,461,730 | B1 | 10/2019 | Mariconti et al. |
| 10,469,057 | B1 | 11/2019 | Frank et al. |
| 10,469,075 | B2 | 11/2019 | Horvath |
| 10,514,016 | B1 | 12/2019 | Nodake |
| 10,587,262 | B1 | 3/2020 | Morini et al. |
| 10,587,268 | B2 | 3/2020 | Li et al. |
| 10,608,625 | B1 | 3/2020 | Bernacchia et al. |
| 10,680,601 | B1 | 6/2020 | Kempitiya |
| 10,715,132 | B2 | 6/2020 | Takayama |
| 10,742,108 | B2 | 8/2020 | Tomisawa et al. |
| 10,763,848 | B2 | 9/2020 | Takano et al. |
| 10,778,195 | B2 | 9/2020 | Gokan |
| 10,784,857 | B1 | 9/2020 | Li et al. |
| 10,790,818 | B1 | 9/2020 | Frank |
| 10,819,212 | B1 | 10/2020 | Nagano et al. |
| 10,917,083 | B2 | 2/2021 | Masuhara et al. |
| 11,057,029 | B2 | 7/2021 | Westwick et al. |
| 2002/0109417 | A1 | 8/2002 | Torrisi et al. |
| 2004/0136135 | A1 | 7/2004 | Takahashi |
| 2004/0251951 | A1 | 12/2004 | Beck |
| 2008/0106319 | A1 | 5/2008 | Bayerer |
| 2008/0315925 | A1 | 12/2008 | Alfano |
| 2009/0021294 | A1 | 1/2009 | Morishita |
| 2010/0148830 | A1 | 6/2010 | Nilson |
| 2011/0050198 | A1 | 3/2011 | Dong et al. |
| 2011/0157919 | A1 | 6/2011 | Yedevelly et al. |
| 2011/0157941 | A1 | 6/2011 | Yedevelly et al. |
| 2012/0013370 | A1 | 1/2012 | Mori |
| 2012/0161841 | A1 | 6/2012 | Dong et al. |
| 2012/0194218 | A1 | 8/2012 | Or-Bach |
| 2012/0218669 | A1 | 8/2012 | Ioannidis et al. |
| 2013/0088894 | A1 | 4/2013 | Pal et al. |
| 2013/0242438 | A1 | 9/2013 | Fukuta |
| 2014/0077782 | A1 | 3/2014 | Cortigiani et al. |
| 2015/0015309 | A1 | 1/2015 | Werber |
| 2015/0070078 | A1 | 3/2015 | Jeong et al. |
| 2015/0085403 | A1 | 3/2015 | Santos et al. |
| 2015/0130476 | A1* | 5/2015 | Takahashi ............ H02H 7/1213 324/537 |
| 2016/0087560 | A1 | 3/2016 | Miller |
| 2016/0218046 | A1 | 7/2016 | Or-Bach |
| 2016/0359480 | A1 | 12/2016 | Kim |
| 2018/0026629 | A1 | 1/2018 | Ptacek |
| 2018/0115310 | A1 | 4/2018 | Horiguchi et al. |
| 2018/0351546 | A1 | 12/2018 | Horvath |
| 2019/0229640 | A1 | 7/2019 | Aichriedler |
| 2019/0305600 | A1* | 10/2019 | Nakao .................... H02J 50/12 |
| 2019/0372567 | A1 | 12/2019 | Yoshida et al. |
| 2020/0057903 | A1 | 2/2020 | Yamato et al. |
| 2020/0008918 | A1 | 3/2020 | Kallikuppa et al. |
| 2020/0089183 | A1 | 3/2020 | Kallikuppa et al. |
| 2021/0305927 | A1 | 9/2021 | Kirby et al. |

OTHER PUBLICATIONS

Agilent Technologies, "2.0 Amp Gate Drive Optocoupler with Integrated (VCE) Desaturation Detection and Fault Status Feedback," HCPL-316J, Mar. 1, 2005, 33 pages.

Allan, R., "SiC and GaN vs. IGBTs: The Imminent Tug of War for Supremacy," Power Electronics, downloaded from powerelectronics.com, Feb. 24, 2020, 2 pages.

Analog Devices, Inc., "Isolated Half-Bridge Driver with Integrated High-Side Supply," ADuM5230, 2008-2013, 16 pages.

Analog Devices, Inc., "Isolated Half-Bridge Gate Driver with Integrated Isolated High-Side Supply," ADuM6132, 2008-2012 16 pages.

Avago Technologies, "Desaturation Fault Detection Optocoupler Gate Drive Products with Feature: ACPL-333J, ACPL-330J, ACPL-332J, ACPL-331J, and HCPL-316J," Application Note 5324, Jan. 9, 2012, 7 pages.

Avago Technologies, "Dual-Output Gate Drive Optocoupler Interface with Integrated (VCE) DESAT Detection, FAULT and UVLO Status Feedback," ACPL-339J, Jan. 31, 2013, 23 pages.

Avago Technologies, "Active Miller Clamp Products with Feature: ACPL-331J, ACPL-332J," Application Note 5314, Jul. 21, 2010, 6 pages.

Infineon, "EiceDRIVER™ External Booster for Driver IC," Application Note, AN2013-10, Revision 1.6, Aug. 5, 2014, 17 pages.

Infineon, "EiceDRIVER™ High Voltage Gate Driver IC with Reinforced Isolation," Final Datasheet, Revision 2.1, Oct. 22, 2018, pp. 1-33.

Obara, H., et al., "Active Gate Control in Half-Bridge Inverters Using Programmable Gate Driver ICs to Improve Both Surge Voltage and Converter Efficiency," IEEE Transactions on Industry Applications, vol. 54, No. 5, Sep./Oct. 2018, pp. 4603-4611.

Silicon Labs, "AN1009: Driving MOSFET and IGBT Switches Using the Si828x," downloaded from silabs.com on Feb. 21, 2020, 22 pages.

Silicon Labs, "Si8285/86 Data Sheet," downloaded from silabs.com on Feb. 21, 2020, 33 pages.

Texas Instruments, "Fully-Differential Isolation Amplifier," AMC1200 AMC1200B, Apr. 2011—Revised Aug. 2012, 24 pages.

Texas Instruments, "Precision Lowest-Cost Isolation Amplifier," ISO124, Sep. 1997—Revised Sep. 2005, 17 pages.

Texas Instruments, "Ti Designs, IGBT Gate Driver Reference Design for Parallel IGBTs with Short-Circuit Protection and External BJT Buffer," TIDUC70A, December 2016—Revised Jan. 2017, 33 pages.

Texas Instruments, "Understanding the Short Circuit Protection for Silicon Carbide MOSFETs," TI TechNotes, January 2018—Revised Mar. 2019, pp. 1-4.

Vacca, G., "Benefits and Advantages of Silicon Carbide Power Devices Over Their Silicon Counterparts," Semiconductor Today, Compounds & Advanced Silicon, vol. 12, Issue 3, Apr./May 2017, 4 pages.

U.S. Appl. No. 17/138,091, filed Dec. 30, 2020, entitled "Variable Current Drive for Isolated Gate Drivers," by inventors Ion C. Tesu et al.

(56) References Cited

OTHER PUBLICATIONS

U.S. Appl. No. 17/197,985, filed Mar. 10, 2021, entitled "Validation of Current Levels Delivered by a Gate Driver," by inventors James E. Heckroth and Ion C. Tesu.
Zhao, S., et al., "Adaptive Multi-Level Active Gate Drivers for SiC Power Devices," IEEE Transactions on Power Electronics, vol. 35, No. 2, Feb. 2020, 17 pages.
Schindler, A., et al., "10ns Variable Current Gate Driver with Control Loop for Optimized Gate Current Timing and Level Control for In-Transition Slope Shaping," IEEE Applied Power Electronics Conference and Exposition (APEC), Mar. 26-30, 2017, 6 pages.
International Search Report and Written Opinion mailed Mar. 31, 2022, PCT/US2021/061550 (8 pages).

\* cited by examiner

1001 PARAMETER VALUE LOOK-UP TABLES

INDEXED VALUES FOR TIME PARAMETERS

| 3-bit Index | 8-bit value (Time) |
|---|---|
| 000 | 00000100 (41.6ns) |
| 001 | 00000101 (62.4ns) |
| 010 | 00001010 (104.0ns) |
| 011 | 00010100 (208.0ns) |
| 100 | 01001001 (759.2ns) |
| 101 | 01011111 (998.4ns) |
| 110 | 01111111 (1320.8ns) |
| 111 | 11111111 (2652.0ns) |

1003 INDEXED VALUES FOR VOLTAGE PARAMETERS

| 3-bit Index | 5-bit value (Voltage) |
|---|---|
| 000 | 00011 (1.05V) |
| 001 | 00110 (2.10V) |
| 010 | 01111 (5.25V) |
| 011 | 10001 (5.95V) |
| 100 | 10010 (6.30V) |
| 101 | 10011 (6.65V) |
| 110 | 10100 (7.00V) |
| 111 | 10110 (7.70V) |

1005 INDEXED VALUES FOR CURRENT PARAMETERS

| 3-bit Index | 5-bit value (Current) |
|---|---|
| 000 | 00001 (0.39A) |
| 001 | 00010 (0.77A) |
| 010 | 01001 (3.48A) |
| 011 | 01101 (5.03A) |
| 100 | 10001 (6.58A) |
| 101 | 10110 (8.51A) |
| 110 | 11011 (10.45A) |
| 111 | 11111 (12.00A) |

1007 WORKING REGISTERS — TIMER THRESHOLDS

| | |
|---|---|
| $t_{ON1}$ | 00001010 (104.0ns) |
| $t_{ON2}$ | 00001010 (104.0ns) |
| $t_{OFF1}$ | 00001010 (104.0ns) |
| $t_{OFF2}$ | 00010100 (208.0ns) |
| $t_{OFF3}$ | 00001010 (104.0ns) |
| $t_{SSA1}$ | 00001010 (104.0ns) |
| $t_{SSA2}$ | 11111111 (2652.0ns) |
| $t_{SSA3}$ | 00010100 (208.0ns) |
| $t_{SSB1}$ | 00001010 (104.0ns) |
| $t_{SSB3}$ | 00010100 (208.0ns) |
| $t_{SSB2}$ | 01111111 (1320.8ns) |

1009 WORKING REGISTERS — VOLTAGE THRESHOLDS

| | |
|---|---|
| $V_{PLAT\_ON}$ | 10100 (VMID+7.00V) |
| $V_{PLAT\_OFF}$ | 10110 (VMID+7.70V) |
| $V_{PLAT\_SSA}$ | 10110 (VMID+7.70V) |
| $V_{PLAT\_SSB}$ | 10110 (VMID+7.70V) |

1011 WORKING REGISTERS — CURRENT SETPOINTS

| | |
|---|---|
| $I_{ON1\_SET}$ | 11111 (12.00A) |
| $I_{ON2\_SET}$ | 10001 (6.58A) |
| $I_{OFF1\_SET}$ | 11111 (12.00A) |
| $I_{OFF2\_SET}$ | 10001 (6.58A) |
| $I_{MC\_SET}$ | 11111 (12.00A) |
| $I_{SSA1\_SET}$ | 10110 (8.51A) |
| $I_{SSA2\_SET}$ | 00010 (0.77A) |
| $I_{SSB1\_SET}$ | 11011 (10.45A) |
| $I_{SSB2\_SET}$ | 01001 (3.48A) |

FIG. 10B

VCD PROFILE COMPONENT REGISTERS

| ON_P1a | | |
|---|---|---|
| $I_{ON1}$ | $V_{PLAT\_ON}$ | $t_{ON1}$ |
| 111 | 110 | 010 |

| ON_P2a | | |
|---|---|---|
| $I_{ON2}$ | $V_{GSON\_UV}$* | $t_{ON2}$ |
| 100 | | 010 |

| ON_P1b | | |
|---|---|---|
| $I_{ON1}$ | $V_{PLAT\_ON}$ | $t_{ON1}$ |
| 111 | 110 | 010 |

| ON_P2b | | |
|---|---|---|
| $I_{ON2}$ | $V_{GSON\_UV}$* | $t_{ON2}$ |
| 100 | | 010 |

| OFF_P1a | | |
|---|---|---|
| $I_{OFF1}$ | $V_{PLAT\_OFF}$ | $t_{OFF1}$ |
| 111 | 111 | 010 |

| OFF_P2a | | |
|---|---|---|
| $I_{OFF2}$ | $V_{MC}$* | $t_{OFF2}$ |
| 100 | | 011 |

| OFF_P3a | | |
|---|---|---|
| $I_{MC}$ | $V_{GSON\_OV}$* | $t_{OFF3}$ |
| 111 | | 010 |

| OFF_P1b | | |
|---|---|---|
| $I_{OFF1}$ | $V_{PLAT\_OFF}$ | $t_{OFF1}$ |
| 111 | 111 | 010 |

| OFF_P2b | | |
|---|---|---|
| $I_{OFF2}$ | $V_{MC}$* | $t_{OFF2}$ |
| 100 | | 011 |

| SSA_P1a | | |
|---|---|---|
| $I_{SSA1}$ | $V_{PLAT\_SSA}$ | $t_{SSA1}$ |
| 101 | 111 | 010 |

| SSA_P2a | | |
|---|---|---|
| $I_{SSA2}$ | $V_{MC}$* | $t_{SSA2}$ |
| 001 | | 111 |

| SSA_P3a | | |
|---|---|---|
| $I_{MC}$ | $V_{GSOFF\_OV}$ | $t_{SSA3}$ |
| | | 011 |

| SSB_P1a | | |
|---|---|---|
| $I_{SSB1}$ | $V_{PLAT\_SSB}$ | $t_{SSB1}$ |
| 110 | 111 | 010 |

| SSB_P2a | | |
|---|---|---|
| $I_{SSB2}$ | $V_{MC}$* | $t_{SSB2}$ |
| 010 | | 110 |

| SSB_P3a | | |
|---|---|---|
| $I_{MC}$ | $V_{GSOFF\_OV}$ | $t_{SSB3}$ |
| | | 011 |

FIG. 11A

VCD PROFILE COMPOSITION

| Profile to Profile Component Mapping | | | | | | | | | |
|---|---|---|---|---|---|---|---|---|---|
| Profile | VCD Profile Components Selected | | | | | | | | |
| 0000 | ON_P1a | ON_P2a | OFF_P1a | OFF_P2a | OFF_P3a | SSA_P1a | SSA_P2a | SSB_P1a | SSB_P2a |
| 0001 | ON_P1a | ON_P2a | OFF_P1a | OFF_P2b | OFF_P3a | SSA_P1a | SSA_P2a | SSB_P1a | SSB_P2a |
| 0010 | ON_P1a | ON_P2a | OFF_P1b | OFF_P2a | OFF_P3a | SSA_P1a | SSA_P2a | SSB_P1a | SSB_P2a |
| 0011 | ON_P1a | ON_P2a | OFF_P1b | OFF_P2b | OFF_P3a | SSA_P1a | SSA_P2a | SSB_P1a | SSB_P2a |
| 0100 | ON_P1a | ON_P2b | OFF_P1a | OFF_P2a | OFF_P3a | SSA_P1a | SSA_P2a | SSB_P1a | SSB_P2a |
| 0101 | ON_P1a | ON_P2b | OFF_P1a | OFF_P2b | OFF_P3a | SSA_P1a | SSA_P2a | SSB_P1a | SSB_P2a |
| 0110 | ON_P1a | ON_P2b | OFF_P1b | OFF_P2a | OFF_P3a | SSA_P1a | SSA_P2a | SSB_P1a | SSB_P2a |
| 0111 | ON_P1a | ON_P2b | OFF_P1b | OFF_P2b | OFF_P3a | SSA_P1a | SSA_P2a | SSB_P1a | SSB_P2a |
| 1000 | ON_P1b | ON_P2a | OFF_P1a | OFF_P2a | OFF_P3a | SSA_P1a | SSA_P2a | SSB_P1a | SSB_P2a |
| 1001 | ON_P1b | ON_P2a | OFF_P1a | OFF_P2b | OFF_P3a | SSA_P1a | SSA_P2a | SSB_P1a | SSB_P2a |
| 1010 | ON_P1b | ON_P2a | OFF_P1b | OFF_P2a | OFF_P3a | SSA_P1a | SSA_P2a | SSB_P1a | SSB_P2a |
| 1011 | ON_P1b | ON_P2a | OFF_P1b | OFF_P2b | OFF_P3a | SSA_P1a | SSA_P2a | SSB_P1a | SSB_P2a |
| 1100 | ON_P1b | ON_P2b | OFF_P1a | OFF_P2a | OFF_P3a | SSA_P1a | SSA_P2a | SSB_P1a | SSB_P2a |
| 1101 | ON_P1b | ON_P2b | OFF_P1a | OFF_P2b | OFF_P3a | SSA_P1a | SSA_P2a | SSB_P1a | SSB_P2a |
| 1110 | ON_P1b | ON_P2b | OFF_P1b | OFF_P2a | OFF_P3a | SSA_P1a | SSA_P2a | SSB_P1a | SSB_P2a |
| 1111 | ON_P1b | ON_P2b | OFF_P1b | OFF_P2b | OFF_P3a | SSA_P1a | SSA_P2a | SSB_P1a | SSB_P2a |

FIG. 11B

UPDATING CONTROL PARAMETERS OF A GATE DRIVER DURING OPERATION

CROSS-REFERENCE TO RELATED APPLICATION(S)

This application claims the benefit of U.S. Provisional Application No. 63/121,949, entitled "EFFICIENTLY UPDATING CONTROL PARAMETERS OF GATE DRIVERS DURING OPERATION," naming James E. Heckroth, Ion C. Tesu, and John N. Wilson, as inventors, filed on Dec. 6, 2020, which application is incorporated herein by reference.

BACKGROUND

Field of the Invention

This disclosure is related to circuits and more particularly to updating parameters used by gate drivers.

Description of the Related Art

In a typical control application, a processor system provides one or more control signals for controlling a load system. During normal operation, a large DC or transient voltage difference may exist between a domain of the processor system and a domain of the load system, thus requiring an isolation barrier between the processor system and the load system. For example, one domain may be grounded at a voltage that is switching with respect to earth ground by hundreds or thousands of volts. Accordingly, an intermediate system includes isolation that prevents damaging currents from flowing between the processor system and the load system. Although the isolation prevents the processor system from being coupled to the load system by a direct conduction path, an isolation communications channel allows communication between the two systems using optical (opto-isolators), capacitive, inductive (transformers), or electromagnetic techniques. In at least one embodiment, the isolation communications channel blocks DC signals and only passes AC signals. The intermediate system typically uses a voltage converter and output driver to provide the control signal at voltage levels suitable for the load system.

Referring to FIG. 1, in an exemplary motor control application, processor 100, which may be a microprocessor, microcontroller, or other suitable processing device, operates in a first domain (i.e., VDD1, e.g., 5 Volts (V)), serves as a host controller and provides one or more signals for a high power load system operating in a second domain (i.e., VDD3, e.g., 800 V). Systems 102 each include an isolation barrier 130 and an isolation communications channel for safely communicating control signals from processor 100 to drivers 106, which drive high-power drive devices 108 and 109 of a three-phase inverter used to deliver three-phase power to motor 120. Exemplary high-power drive devices include power metal-oxide-semiconductor field-effect transistors (MOSFETs), insulated-gate bipolar transistors (IGBTs), Gallium-Nitride (GaN) MOSFETs, Silicon-Carbide power MOSFETs, or other suitable devices able to deliver high currents over short periods of time.

Voltage converters 104 convert an available power supply voltage from VDD3 to a voltage level (i.e., VDD2, e.g., approximately 15 V) usable by a high side of systems 102 and drivers 106. Note that in other embodiments, a single voltage converter 104 converts one power supply voltage from a first voltage level (e.g., VDD3) to multiple other voltage levels (e.g., VDD1 and VDD2) and/or provides multiple outputs of a particular voltage (e.g., multiple VDD2 outputs corresponding to multiple systems 102). Drivers 106 provide switch control signals at levels required by corresponding high-power drive devices 108 or 109 of the three-phase inverter. The load motor requires three-phase power at high power levels. Systems 102 that correspond to high-power devices coupled to VDD3 (high-side inverter devices), are grounded at a voltage that is switching with respect to earth ground by the high voltage levels of VDD3. Typical high-power drive devices 108 and 109 of the three-phase inverter that are used to drive motor 120 require substantial turn-on voltages (e.g., voltages in the range of tens of Volts) and are susceptible to fault conditions that may damage those devices.

Exemplary isolated gate drivers are used in industrial and automotive applications. Conventional embodiments of gate drivers use fixed resistors to determine a fixed drive strength during the high-power drive device normal turn-on and normal turn-off process. The fixed drive strength determines a compromise between the competing goals of maximizing efficiency, minimizing radiated and conducted emissions (i.e., electromagnetic interference (EMI)), and limiting voltage stress on the external high-power drive device.

Thus, traditional gate driver solutions have fixed turn-on and turn-off characteristics. Other solutions, such as driver with multiple outputs, have a limited number of possible settings/adjustments. Thus, it is impractical to adjust or compensate for changing operating conditions (operating temperature, motor RPM, required torque, regenerative braking, etc.) with these solutions. Accordingly, improved techniques for controlling high-power drive devices are desired.

SUMMARY OF EMBODIMENTS OF THE INVENTION

In one embodiment a method includes updating one or more operating parameters of a gate driver responsive to an update request during an operating mode of the gate driver in which switching operations occur. The one or more operating parameters being updated include one or more turn-on parameters, one or more turn-off parameters, or both the one or more turn-on parameters and the one or more turn-off parameters. The turn-on parameters and the turn-off parameters are associated with supplying an output signal supplied by the gate driver to drive a device. The method further includes using the turn-on parameters for a first plurality of turn-on phases for an output signal that is coupled to the device that is driven by the gate driver and using the turn-off parameters for a second plurality of turn-off phases for the output signal.

In another embodiment a gate driver includes a variable strength driver circuit configured to provide an output signal to an output node. The gate driver is responsive to an update request from a host controller during an operating mode in which switching operations occur, to update one or more turn-on parameters, one or more turn-off parameters, or both the one or more turn-on parameters and the one or more turn-off parameters. The turn-on parameters and the turn-off parameters are associated with supplying the output signal supplied by the gate driver. The gate driver is configured to use the turn-on parameters for a first plurality of turn-on phases for the output signal and to use the turn-off parameters for a second plurality of turn-off phases for the output signal. Storage locations in the gate driver store the turn-on parameters and the turn-off parameters and one or more of the storage locations is updated responsive to the update request.

In another embodiment a gate driver includes a variable strength driver circuit configured to provide an output signal to an output node. The gate driver is responsive to an update request from a host controller during an operating mode in which switching operations occur, to update one or more operating parameters, the operating parameters including turn-on parameters, turn-off parameters, and soft shutdown parameters. The gate driver is configured to use the turn-on parameters for a first plurality of turn-on phases for the output signal, to use the turn-off parameters for a second plurality of turn-off phases for the output signal, and to use the soft shutdown parameters for a third plurality soft shutdown phases for the output signal. Storage locations in the gate driver store the turn-on parameters, the turn-off parameters, and the soft shutdown parameters. One or more of the storage locations is updated responsive to the update request. The storage locations include profile component registers containing pointers to parameter value look up tables for the turn-on phases, the turn-off phases, and the soft shutdown phases. The storage locations further include working registers coupled to the parameter values look up tables. The working registers store current values of the turn-on parameters, the turn-off parameters, and the soft shutdown parameters for use by the variable strength driver circuit.

BRIEF DESCRIPTION OF THE DRAWINGS

The present invention may be better understood, and its numerous objects, features, and advantages made apparent to those skilled in the art by referencing the accompanying drawings.

FIG. 10B illustrates parameter values mapping to working registers consistent with at least one embodiment of the invention.

FIG. 11A illustrates an example of stored VCD Profile Components.

FIG. 11 B illustrates a mapping of the Profile Components into VCD Profiles.

The use of the same reference symbols in different drawings indicates similar or identical items.

DETAILED DESCRIPTION

Figure 2:
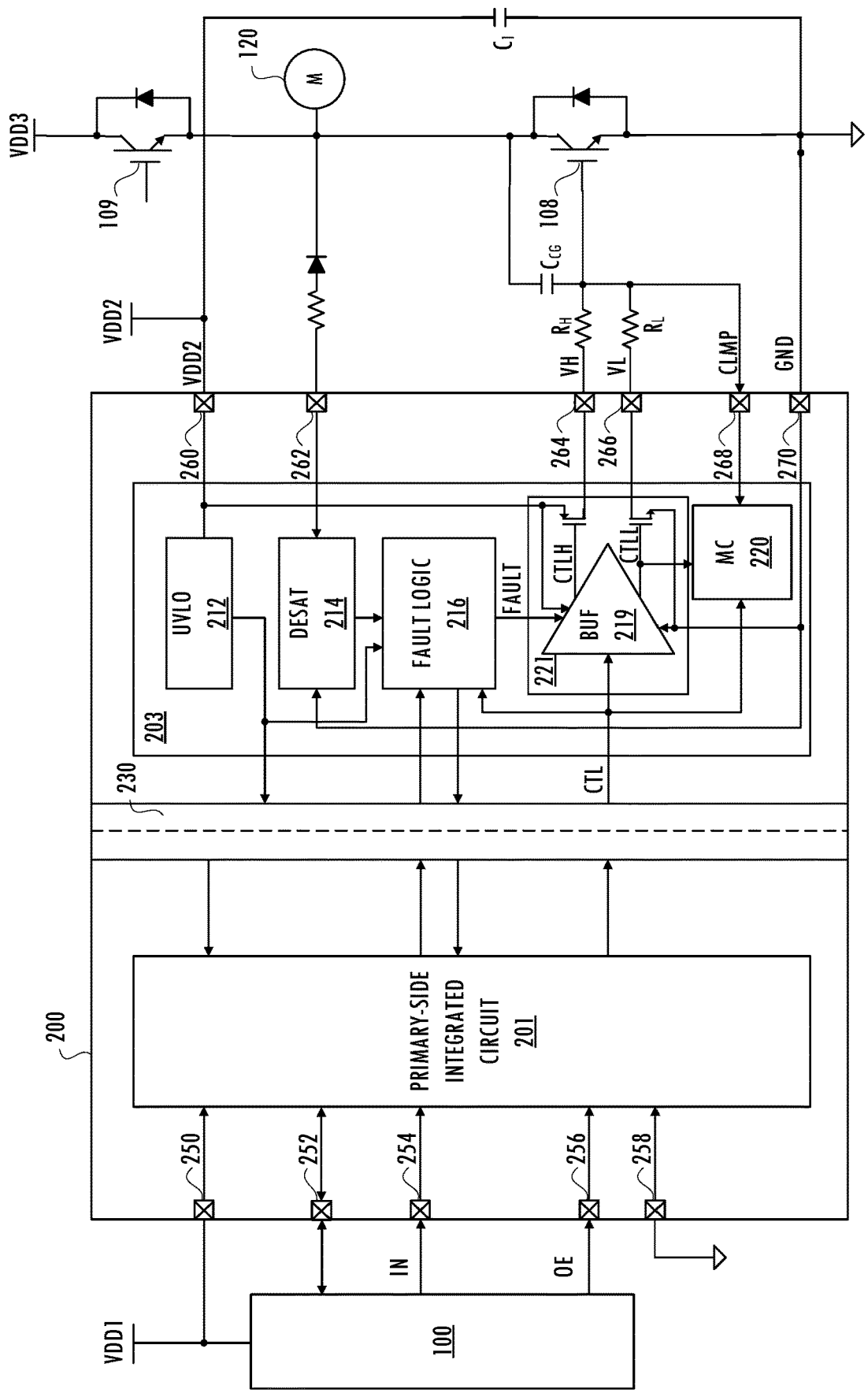
FIG. 2 illustrates a functional block diagram of a portion of the motor control system of FIG. 1 including exemplary fault detection circuitry and driver control circuits.

Referring to FIG. 2, in an exemplary motor control application, processor 100 receives a voltage (i.e., VDD1, e.g., 5V) and provides one or more signals for a high power load system operating in a second domain (i.e., VDD3, e.g., hundreds of volts). Driver product 200 includes isolation barrier 230 and a communication channel for safely communicating control signals from processor 100 across isolation barrier 230 to drive a high-power drive device of a three-phase inverter used to deliver three-phase power to motor 120. In an exemplary embodiment, driver product 200 includes multiple integrated circuits configured as a multi-chip module in a single package. For example, driver product 200 includes primary-side integrated circuit 201 and secondary-side integrated circuit 203. Primary-side integrated circuit 201, receives a control signal from processor 100 and communicates the signal across isolation barrier 230 to secondary-side integrated circuit 203. In such embodiments, terminals 250, 252, 254, . . . , 270 are pins of a package of the multi-chip module and are coupled to external elements, e.g., discrete resistors and capacitors, and to processor 100.

Driver product 200 includes isolation barrier 230, which isolates the domains on a first side (e.g., primary-side integrated circuit 201) of driver product 200, which operates using VDD1 (e.g., a voltage less than ten volts), and a second side (e.g., secondary-side integrated circuit 203) of driver product 200, which operates using VDD2 (e.g., a voltage of tens of volts). An isolation communications channel facilitates communication between primary-side integrated circuit 201 and secondary-side integrated circuit 203. Any suitable communications technique that does not use a conductive path between the two sides may be used, e.g., optical, capacitive, inductive, or electromagnetic techniques. The isolation communications channel facilitates communication of a control signal to secondary-side integrated circuit 203 from processor 100 via primary-side integrated circuit 201.

An exemplary isolation communications channel uses digital modulation (e.g., on-off keying modulation) to communicate one or more digital signals between primary-side integrated circuit 201 and secondary-side integrated circuit 203, although other communication protocols may be used. In general, on-off keying modulation is a form of amplitude-shift keying modulation that represents digital data as the presence or absence of a carrier wave or oscillating signal having a carrier frequency fc (e.g., 500 MHz-1 GHz). The presence of the carrier for a specified duration represents a binary one, while its absence for the same duration represents a binary zero. This type of signaling is robust for isolation applications because a logic '0' state sends the same signal (e.g., nothing) as when the primary side loses power and the device gracefully assumes its default state. That behavior is advantageous in driver applications because it will not accidentally turn on a load device being driven, even when the primary side loses power. However, the isolation communications channel may use other types of signals (e.g., pulse width modulated signals or other types of amplitude shift keying modulated signals). The digital modulation scheme used may be determined according to performance specifications (e.g., signal resolution) and environment (e.g., probability of transient events) of the target application.

Secondary-side integrated circuit 203 includes driver 221, which generates one or more output control signals based on received control signal CTL received from primary-side integrated circuit 201, which receives control signal IN on terminal 254 from processor 100. Driver 221 provides corresponding signals to terminals 264 and 266. Buffer 219 generates control signals CTLH and CTLL at appropriate signal levels for controlling pull-up and pull-down devices of driver 221, respectively. Buffer 219 may generate one control signal or two separate control signals for the pull-up device and the pull-down device based on received control signal CTL. External resistance $R_H$ adjusts the pull-up strength by $1/R_H$ independently from external resistance $R_L$ that adjusts the pull-down strength by $1/R_L$. Although received control signal CTL is illustrated as a single-ended signal based on input control signal CTL received from processor 100 on terminal 254, note that in other embodiments, input control signal IN and received control signal CTL are differential signals. In general, signals illustrated herein as single-ended signals may be implemented as differential signals in other embodiments and signals illustrated herein as differential signals may be implemented as single-ended signals in other embodiments.

The pull-up strength and the pull-down strength of the output control signal provided to the control terminal of high-power drive device 108 can be independently adjusted from on-resistance $R_{DS(ON)}$ of the integrated pull-up output device coupled to terminal 264 using one or more passive elements. For example, resistance $R_H$ adjusts the pull-up strength. Resistor $R_L$ adjusts the pull-down strength of the signal provided to the gate of high-power drive device 108 via terminal 266 to have a strength different from the pull-up strength of the signal provided to the gate of high-power drive device 108. In a typical configuration, the pull-up time is slower than the pull-down time and resistances $R_H$ and $R_L$ will vary with specifications of the device (e.g., power MOSFET, IGBT, GaN MOSFET, Si-Carbide power MOSFET, etc.) used as high-power drive device 108.

In at least one embodiment, the isolation communications channel feeds back voltage information or fault information from secondary-side integrated circuit 203 to primary-side integrated circuit 201. Primary-side integrated circuit 201 or processor 100 uses that information to adjust operating parameters or generate one or more fault indicators that may be used for automatically handling faults by controlling output driver 221 accordingly. For example, secondary-side integrated circuit 203 includes modules that detect fault conditions associated with high-power drive devices, e.g., desaturation detector 214, and may also detect user-initiated faults received from processor 100. Fault indicator(s) may be used by secondary-side integrated circuit 203 to prevent damage to the high-power drive devices, load system, or user of the load system. In addition, secondary-side integrated circuit 203 may send an indication of a fault or associated diagnostic information to primary-side integrated circuit 201 and/or processor 100.

Figure 1:
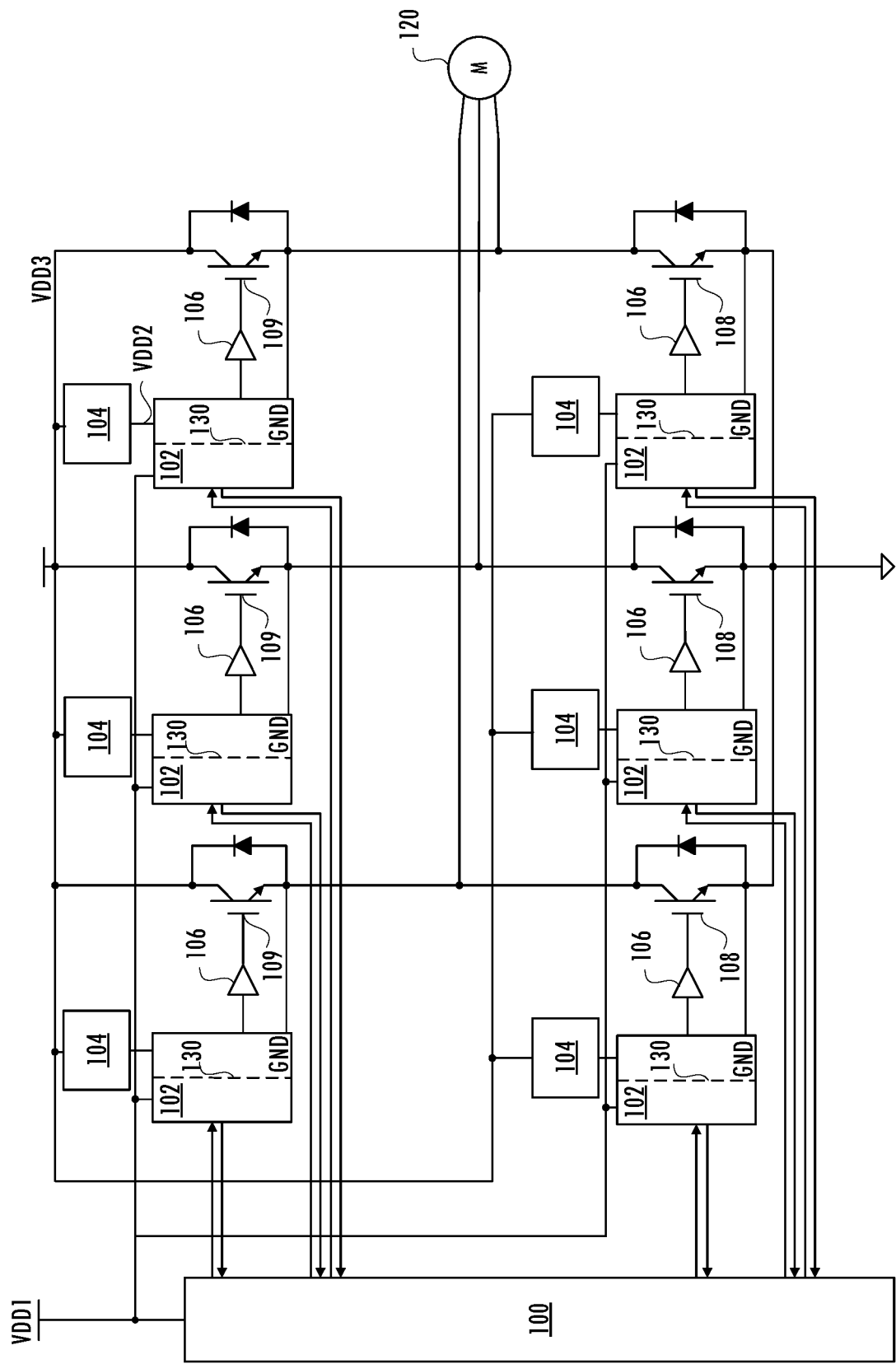
FIG. 1 illustrates a functional block diagram of a typical motor control system.

In at least one embodiment, secondary-side integrated circuit 203 includes desaturation fault protection for high-power semiconductor devices, which protects against short-circuit current events that may destroy high-power drive device 108. This fault may result from an insufficient gate drive signal caused by inverter gate driver misbehavior, drive supply voltage issues, a short circuit in a power stage, or other excessive current or power dissipation of the high-power drive devices. Those events can substantially increase power consumption that quickly overheats and damages the corresponding high-power drive device. For example, when a short circuit current condition occurs in the exemplary motor drive application of FIGS. 1 and 2 (e.g., both devices of an individual inverter phase of a three-phase inverter are on), high current flows through high-power drive devices 108 and 109 and may destroy high-power drive devices 108 and 109. Accordingly, a fault detection technique detects this desaturation condition. Driver product 200 may send an indicator thereof to processor 100.

In at least one embodiment of driver product 200, desaturation fault protection turns off high-power drive device 108 following detection of the fault condition. In a typical application, terminal 262 is coupled to an external resistor and diode that are coupled to a terminal of high-power drive device 108 (e.g., the collector terminal of an IGBT or drain terminal of a MOSFET). In at least one embodiment of driver product 200, desaturation detection circuit 214 is enabled only while high-power drive device 108 is turned on. Desaturation detection circuit 214 senses when the collector-emitter voltage (or drain-to-source voltage, as the case may be) of high-power drive device 108 exceeds a predetermined threshold level (e.g., 7V). Note that the predetermined threshold level of desaturation detection circuit 214 may be externally adjusted based on the forward voltage of one or more diodes coupled to the desaturation resistor coupled to terminal 262 or based on the resistance of the desaturation resistor. In addition, a delay time may be introduced by coupling a capacitor between terminal 262 and an external power supply node.

In general, undervoltage lockout detector 212 prevents application of insufficient voltage to the control terminal of high-power drive device 108 by forcing the output on terminal 264 to be low during power-up of driver product 200. Undervoltage lockout detector 212 detects when the power supply voltage (e.g., VDD2 sensed using terminal 260) exceeds a first predetermined undervoltage lockout threshold voltage and generates an indication thereof, which may be used to disable the lockout condition. Undervoltage lockout detector 212 also detects when the power supply voltage falls below a second predetermined undervoltage lockout threshold, which may be different from the first undervoltage lockout threshold voltage, to provide noise margin for the undervoltage lockout voltage detection. The indicator generated by undervoltage lockout detector 212 may be provided to processor 100 using terminal 252. In at least one embodiment, driver product 200 includes a similar mechanism for an overvoltage condition.

Miller clamp 220 reduces effects of parasitic turn-on of high-power drive device 108 due to charging of the Miller capacitor (e.g., the collector-to-gate parasitic capacitor of an IGBT device or the drain-to-gate parasitic capacitor of a MOSFET in other embodiments of high-power device 108). That gate-to-collector coupling can cause a parasitic turn on of device 108 in response to a high transient voltage (e.g., a gate voltage spike) generated while high-power drive device 108 is turned off. A gate voltage spike is created when turning on another high-power drive device coupled to high-power drive device 108.

For example, when turning on upper high-power drive device 109, a corresponding lower high-power drive device 108 coupled to upper high-power drive device 109 experiences a voltage change $dV_{CE}/dt$ causing current flow into the gate drive terminal coupled to lower high-power drive device 108. In the absence of Miller clamp 220, this current would create a voltage drop across external resistance $R_L$ and would increase the gate-to-emitter voltage of a corresponding lower high-power drive device 108. If the gate-to-emitter voltage exceeds the device threshold voltage (e.g., 2 V), then high-power drive device 108 turns on. A similar parasitic turn-on event occurs when turning on high-power drive device 108 and the corresponding upper high-power drive device 109 is in an off state. Miller clamp 220 prevents parasitic turn-on by coupling terminal 268 to ground via a low-resistance switch that hinders or prevents the Miller capacitor current from developing a voltage sufficient to turn on the high-power drive device.

In some embodiments of driver product 200, Miller clamp 220 is not needed because a sufficiently sized gate capacitor coupled between the gate and emitter of each high-power drive device 108 shunts any Miller current and raises the level of the transient needed to parasitically turn on the device. However, such embodiments increase the gate charge voltage required to reach the threshold voltage of high-power drive device 108, increase the driver power, and increase switching losses of high-power drive device 108. In other embodiments of driver product 200 that do not use a Miller clamp circuit, the lower supply voltage is coupled to a negative voltage (e.g., −5 V) rather than ground. This configuration provides additional voltage margin to increase the likelihood that the parasitic turn-on transient does not raise the control terminal of high-power drive device 108 above its threshold voltage. However, this configuration increases cost by requiring an additional pin on the package and requiring generation of the negative voltage.

Upon detection of a fault condition by modules on secondary-side integrated circuit 203, fault logic 216 generates control signal FAULT, which may initiate shutdown of high-power drive device 108. Fault logic 216 reports the fault condition to processor 100 via primary-side integrated circuit 201. Alternatively, fault logic 216 only reports the fault condition to primary-side integrated circuit 201 and high-power drive device 108 continues operation. Then, primary-side integrated circuit 201 reports the fault condition to processor 100. Since a system may include multiple high-power drive devices (e.g., six high-power drive devices in the exemplary motor control application described herein), shutting down only one of these devices may harm the high-power drive devices or the load. Therefore, in response to detection of a fault, processor 100 may initiate a shutdown of high-power drive device 108 only after detecting a predetermined number of faults over a particular period of time or other condition is satisfied. In at least one embodiment, processor 100 initiates shutdown of high-power drive device 108 independently from any fault detection of driver product 200 (e.g., based on fault detection from another driver product 200 associated with another high-power drive device 108 or 109).

An abrupt shutoff of high-power drive device 108 may result in large di/dt induced voltages. Such voltage spikes could be damaging to high-power drive circuit 108 or the load. Accordingly, in response to a fault condition, processor 100 or driver product 200 initiates a soft shutdown of high-power drive device 108 that slowly discharges the control terminal of high-power drive device 108 at a rate having a turn-off time longer than the regular turn-off time of the output control signal. For example, fault logic 216 receives a indicator from desaturation detection circuit 214 and generates control signal FAULT based thereon that initiates a soft shutdown. In other embodiments, fault logic 216 receives an indicator from one or more other fault detection circuits. Typical implementations of a soft-shutdown function in a driver product may use an additional terminal or at least one additional external resistor coupled to terminal 264 or terminal 266.

A variable current drive technique partitions a transition (e.g., a turn-on or a turn-off) of a state (e.g., on or off) of a high-power drive device into multiple phases (i.e., intervals) that can have different characteristics. The use of variable current driver reduces or eliminates the need for external gate resistors for control of a transition of the state of the high-power drive device. The use of multiple current settings for an output gate driver current (e.g., a gate current of the high-power drive device) during a transition of the output signal improves the transition of the state of the high-power drive device and corresponding efficiency level of the system (i.e., the ratio of useful work performed by the system to the total energy expended by the system, which affects the range of an electric vehicle per battery charge in an exemplary electric vehicle application), reduces EMI, and reduces voltage stress of the high-power drive device, as compared to conventional approaches.

In at least one embodiment of the variable current drive technique, the change of target current levels during a transition of a state of a high-power drive device is based on an indication of a control voltage of the high-power drive device (e.g., gate-to-source voltage $V_{GS}$ sensed using the output node of the gate driver product) and a corresponding time limit. For example, a target current level is changed from a first predetermined current level to a second predetermined current level in response to the gate-to-source voltage $V_{GS}$ of the high-power drive device reaching or exceeding the Miller plateau. The Miller plateau refers to a region of the gate-to-source voltage time response, where the gate-to-source voltage $V_{GS}$ is almost constant and is a region in which the state of the high-power drive device is switching between a first state (e.g., an off-state) to a second state (e.g., an on-state). The Miller plateau is defined by gate-to-source voltage level $V_{PLAT\_ON}$ and gate-to-source voltage level $V_{PLAT\_OFF}$, which are inflection points in the response of gate-to-source voltage $V_{GS}$. In at least one embodiment, an objective of the variable current drive technique is to reach the Miller plateau voltage as quickly as possible. However, to limit electromagnetic interference caused by the current of the variable current drive, the variable current drive technique drives the high current level only for a limited time and decreases the current after reaching the Miller plateau voltage or the expiration of a corresponding time limit. Accordingly, the variable current driver initially drives a high gate current level (e.g., 12 A) to reduce the time required to charge the gate of the high-power drive device to the Miller plateau voltage (or discharge the gate of the high-power drive device to the Miller plateau voltage, as the case may be), after which the variable current driver drives another current level to the gate of the high-power drive device (e.g., 6 A) that achieves a target change in drain-to-source (or collector-to-emitter) voltage as a function of time (e.g., $dV_{DS}/dt_{ON}$ or $dV_{DS}/dT_{OFF}$) for the remainder of the transition of the state of the high-power drive device. The variable current drive technique provides improved capability to optimize the tradeoff between faster switching speed for efficiency, lower $dV_{DS}/dt$ for reduced EMI, and reduced drive device output voltage overshoot as compared to conventional gate driver implementations.

In at least one embodiment of the variable current drive technique, changing target output current levels based on a time limit is used in addition to, or instead of, a threshold voltage criteria for triggering a change to a target output current level. In at least one embodiment, the variable current drive technique uses a combination of the threshold voltage criteria and a time limit (e.g., to change a target current level based on a threshold voltage or based on a time limit, whichever is reached first) to provide more reliable operation in high-noise environments where incorrect switching might otherwise occur due to noise. In at least one embodiment, the variable current drive technique measures elapsed time using a digital counter. In at least one embodiment, the variable current drive technique measures elapsed time using an RC-based system. For example, one or more timers generate indicators of how much time has elapsed since the start of a phase of a multi-phase transition process. Even if a target voltage level has not been achieved on the output node, the variable current drive technique changes the target current level and enters a next phase of the multi-phase transition process in response to expiration of a predetermined amount of time, e.g., to reduce EMI, or in response to expiration of a predetermined amount of time and another condition (e.g., a sensed current level or a sensed voltage level exceeding a predetermined threshold level).

Figure 3:
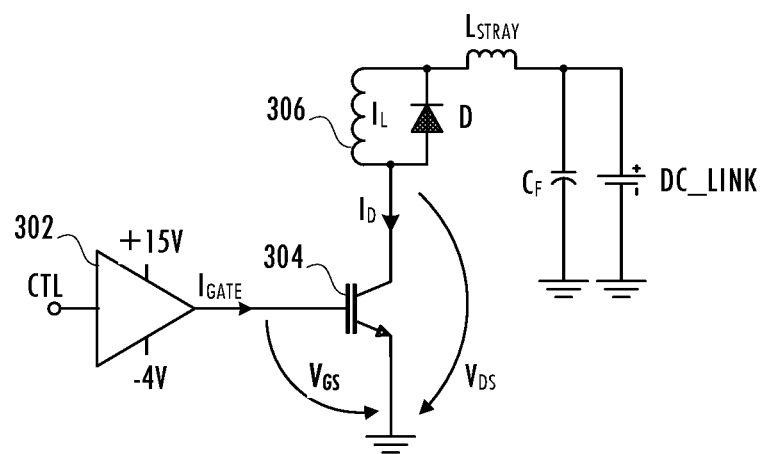
FIG. 3 illustrates an exemplary simplified representation of the portion of the motor control system of FIG. 2.
Figure 4:
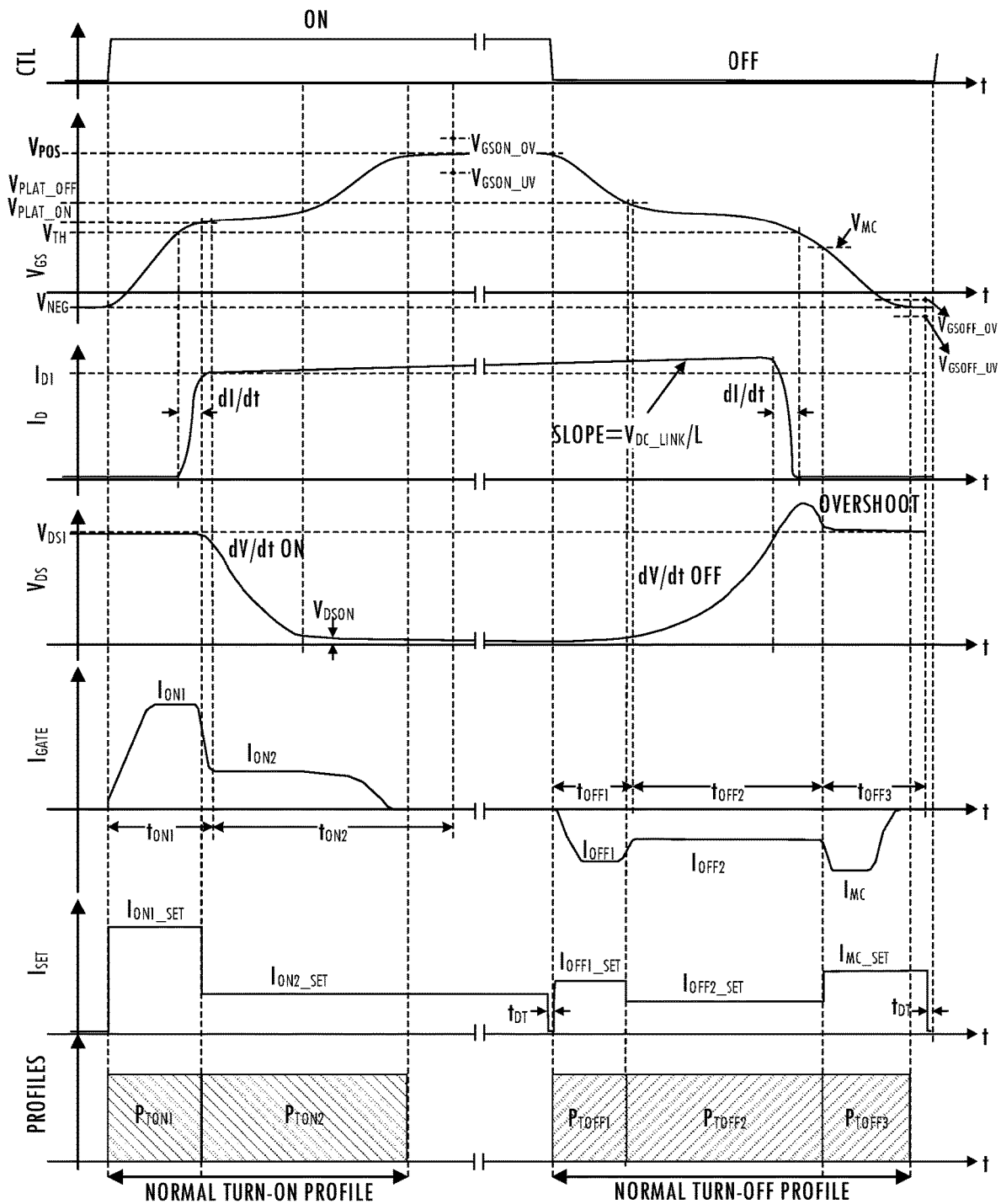
FIG. 4 illustrates timing waveforms and switching parameter definitions consistent with at least one embodiment of the invention.

FIGS. 3 and 4 illustrate an exemplary implementation of the variable current drive technique including a multi-phase turn-on process and a multi-phase turn-off process. An exemplary high-power gate driver powered using +15V and −4V power supplies drives high-power drive device 304. Inductor 306, which has an initial condition of $I_L$=20 A and is coupled in parallel with a diode, represents an exemplary load. Exemplary waveforms for the gate current IGATE, which is driven by gate driver 302, drain-to-source voltage VDS, drain current ID, gate-to-source voltage $V_{GS}$, and control signal CTL illustrate an exemplary multi-phase turn-on process and an exemplary multiple phase turn-off process of high-power drive device 304. Target set current $I_{SET}$ illustrates exemplary target current levels (i.e., predetermined target current set points) that are used to program the actual gate current IGATE flowing into the gate of high-power drive device 304. The resulting drain current ID of high-power drive device 304, and associated voltages (e.g., drain-to-source voltage VDS and gate-to-source voltage $V_{GS}$) of high-power drive device 304 represent the response to an exemplary variable current drive profile that uses a combination of parameters, such as the Miller plateau voltages, the Miller clamp voltage, and the time limits for each phase of the multi-phase transition process. Although embodiments described herein use the Miller Plateau voltages as voltage thresholds for triggering a change in the target gate current level of a phase of a multi-phase turn-on process or multi-phase turn-off process of high-power drive device 304, other voltages, multiple switching voltages, current levels, or combinations thereof are used in other embodiments.

In at least one embodiment of the variable current drive technique, the characteristics of a multi-phase transition process for the high-power drive device are defined by the parameters of a normal turn-on profile (e.g., target current set point, a gate-to-source threshold voltage, and time limit for a phase of the multi-phase transition process). The normal turn-on process includes two phases: phase $P_{TON1}$ and phase $P_{TON2}$. Each phase of the normal turn-on process has a corresponding, individually programmed sourcing current level. For example, phase $P_{TON1}$ has target current set point $I_{ON1\_SET}$. In at least one embodiment of the normal turn-on process, the Miller plateau voltage $V_{PLAT\_ON}$ is used as the threshold voltage to trigger a transition from phase $P_{TON1}$ to phase $P_{TON2}$. In at least one embodiment of the normal turn-on process, target current set point $I_{ON1\_SET}$ is greater than target current set point $I_{ON\_SET2}$ (i.e., $I_{ON1\_SET} > I_{ON2\_SET}$) and time limit $t_{ON1}$ triggers a transition from phase $P_{TON1}$ to phase $P_{TON2}$ to limit the amount of time that the higher current level of target current set point $I_{ON1\_SET}$ is used to limit EMI. The normal turn on process enters phase $P_{TON2}$ even if the gate-to-source voltage $V_{GS}$ does not reach Miller plateau voltage $V_{PLAT\_ON}$ in response to expiration of time limit $t_{ON1}$. Thus, the normal turn-on process progresses from phase $P_{TON1}$ to phase $P_{TON2}$ in response to the gate-to-source voltage $V_{GS}$ of high-power drive device 304 exceeding Miller plateau voltage $V_{PLAT\_ON}$, or in response to the time elapsed in phase $P_{TON1}$ exceeding time limit $t_{ON1}$, whichever condition comes first. Once in phase $P_{TON2}$, the normal turn-on process does not return to phase $P_{TON1}$.

Phase $P_{TON2}$ has target current set point $I_{ON2\_SET}$. Another set of variable current drive turn-on profile parameters also control phase $P_{TON2}$ of the normal turn-on process. For example, current set point $I_{ON2\_SET}$ specifies the target sourcing current level for phase $P_{TON2}$ of the normal turn-on process. Time limit $t_{ON2}$ Specifies the time at which gate-to-source voltage $V_{GS}$ is expected to be above the undervoltage threshold $V_{GSON\_UV}$. In at least one embodiment, control circuitry triggers a fault if time limit $t_{ON2}$ expires prior to gate-to-source voltage $V_{GS}$ exceeding undervoltage threshold $V_{GSON\_UV}$. In at least one embodiment of the variable current drive technique, after gate-to-source voltage $V_{GS}$ reaches voltage level $V_{POS}$, high-power drive device 304 remains on and drain current ID increases at a rate of $V_{DC\_LINK}/L$. A transition of control signal CTL triggers another multi-phase transition process that causes gate-to-source voltage $V_{GS}$ to cross (i.e., fall below) Miller plateau voltage $V_{PLAT\_OFF}$.

In at least one embodiment of the variable current drive technique, the characteristics of a multi-phase transition process are defined by the parameters of a normal turn-off profile (e.g., a target current set point, a threshold voltage, and a time limit for a phase of the multi-phase transition process). The normal turn-off process includes three phases: phase $P_{TOFF1}$, phase $P_{TOFF2}$, and phase $P_{TOFF3}$. Each of the phases has a corresponding, individually programmed sinking current level. For example, phase $P_{TOFF1}$, phase $P_{TOFF2}$, and phase $P_{TOFF3}$ have target current set point $I_{OFF1\_SET}$, target current set point $I_{OFF2\_SET}$, and target current set point $I_{MC\_SET}$, respectively. In at least one embodiment, target current set point $I_{OFF1\_SET}$ is greater than target current set point $I_{OFF2\_SET}$ (i.e., $I_{OFF1\_SET} > I_{OFF2\_SET}$) and target current set point $I_{MC\_SET}$ is greater than or equal to target current set point $I_{OFF1\_SET}$ and greater than target current set point $I_{OFF2\_SET}$ (i.e., $I_{MC\_SET} > I_{OFF1\_SET}$ and $I_{MC\_SET} > I_{OFF2\_SET}$).

Normal turn-off profile parameters including a current level parameter, a threshold voltage parameter and a time parameter (e.g., target current set point $I_{OFF1\_SET}$, threshold voltage $V_{PLAT\_OFF}$, and time limit $t_{OFF1}$) control phase $P_{TOFF1}$. Target current set point $I_{OFF1\_SET}$ specifies the target sinking current level for phase $P_{TOFF1}$, threshold voltage $V_{PLAT\_OFF}$, specifies the threshold voltage for triggering a transition from phase $P_{TOFF1}$ to phase $P_{TOFF2}$ of the normal turn-off process. The time parameter, time limit $t_{OFF1}$ specifies the time limit for phase $P_{TOFF1}$ of the normal turn-off process. Variable current drive normal turn-off profile parameters (e.g., target current set point $I_{OFF2\_SET}$, threshold voltage $V_{MC}$, and time limit $t_{OFF2}$) control phase $P_{TOFF2}$. The current parameter specifies the target sinking current level for phase $P_{TOFF2}$ of the normal turn-off process. The voltage parameter, Miller clamp voltage $V_{MC}$, specifies the threshold voltage for triggering a transition to phase $P_{TOFF3}$, thereby triggering the internal Miller clamp function of the variable strength driver. The time parameter specifies time limit $t_{OFF2}$ for phase $P_{TOFF2}$ to trigger a transition to phase $P_{TOFF3}$ of the normal turn-off process.

Phase $P_{TOFF3}$ of the normal turn-off process is controlled by normal turn-off profile parameters current set point $I_{MC\_SET}$ and time limit $t_{OFF3}$. Current $I_{MC\_SET}$ specifies the sinking target current level for phase $P_{TOFF3}$ of the normal turn-off process. The time limit $t_{OFF3}$ specifies the time at which gate-to-source voltage $V_{GS}$ is expected to fall below over-voltage threshold $V_{GSOFF\_OV}$, which represents the over-voltage limit for the gate-to-source voltage $V_{GS}$ during turn-off. In at least one embodiment, control circuitry triggers a fault if time limit $t_{OFF3}$ expires prior to gate-to-source voltage $V_{GS}$ falling below over-voltage threshold $V_{GSOFF\_OV}$.

In at least one embodiment, in response to each change in state of received control signal CTL, the variable current drive technique introduces a small deadtime, e.g., time delay $t_{DT}$, before initiating a corresponding multi-phase transition process (e.g., a turn-on process or a turn-off process) to reduce or eliminate shoot-through between the pull-up and the pull-down circuits of the gate driver. Multi-phase transition profiles, including parameters and number of phases, described herein are exemplary only. Transition profiles can be optimized for different objectives or operating conditions, to improve efficiency, reduce EMI, and reduce drain-to-source voltage VDS (or collector-to emitter voltage $V_{CE}$) voltage stress, as compared to the conventional approach. In at least one embodiment, a soft-shutdown turn-off profile implements a multi-phase soft shutdown turn-off process, which is initiated by gate driver 302 in response to detection of a fault (e.g., a short-circuited load of the power switch). In at least one embodiment, the soft-shutdown turn-off process uses the same turn-off process as a normal turn-off process, but with different parameters. For example, the target current set point $I_{SS2\_SET}$ parameter (which corresponds to target current set point $I_{OFF2\_SET}$ of the normal turn-off profile) is set to a lower value under short-circuit load conditions than that used for normal load currents to slow the turn-off process and reduce or eliminate any resulting overshoot of drain-to-source voltage VDS (or collector-to emitter voltage $V_{CE}$) that may damage the high-power drive device. In at least one embodiment of a multi-phase transition profile, a time limit in one or more phases of a turn-on process or a turn-off process triggers a measurement that is used to detect faults.

Figure 5:
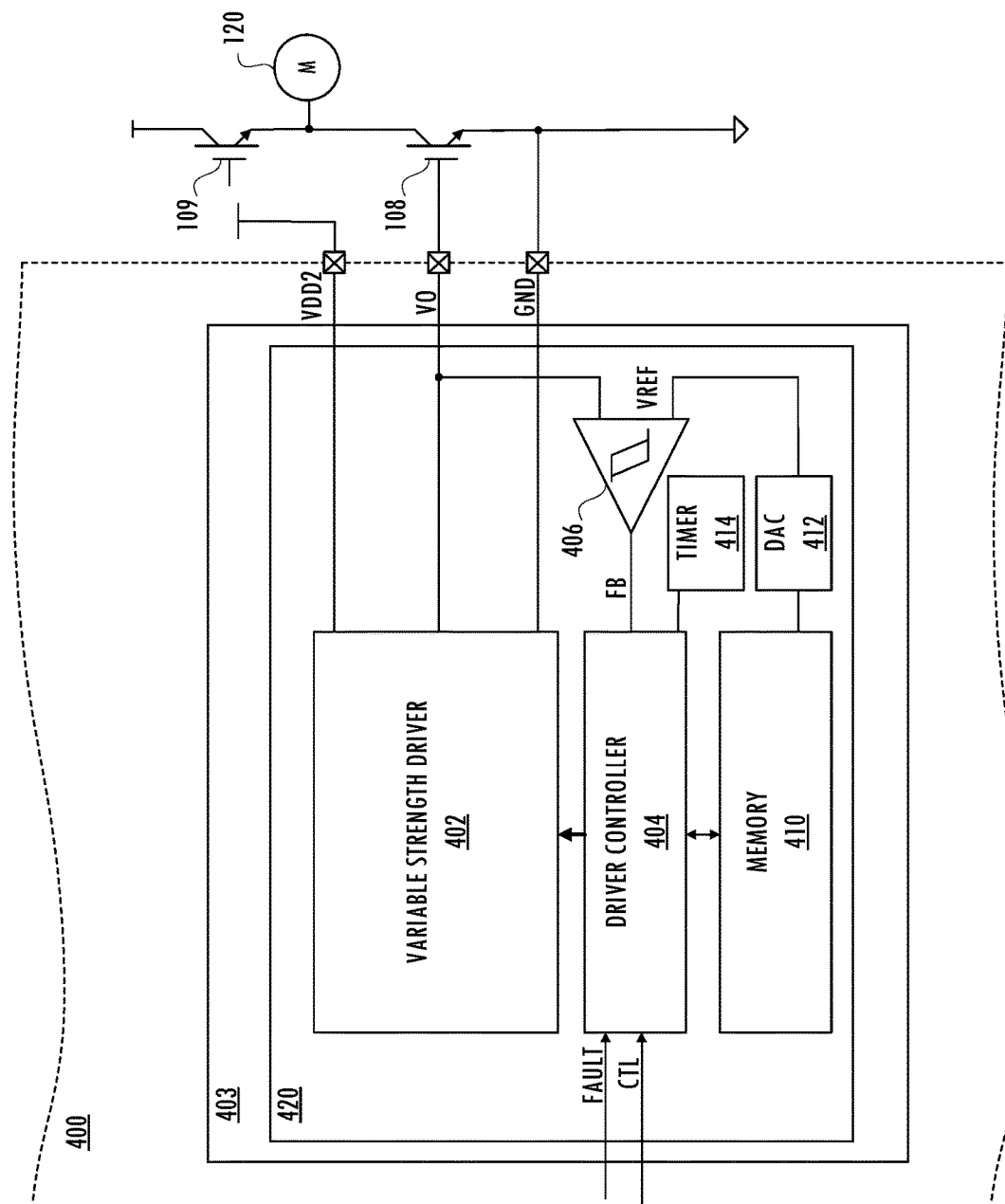
FIG. 5 illustrates a functional block diagram of a portion of a packaged driver integrated circuit product including a variable strength driver circuit consistent with at least one embodiment of the invention.

Referring to FIG. 5, in at least one embodiment, driver product 400 includes a primary-side integrated circuit, isolation barrier, and isolation communications channel (not shown in FIG. 5, but described above), and secondary-side integrated circuit 403. In at least one embodiment, secondary-side integrated circuit 403 of driver product 400 includes gate driver 420 coupled to terminal VO, which in some embodiments is the only terminal of driver product 400 that is coupled to the gate terminal of high-power drive device 108. In at least one embodiment, gate driver 420 integrates the Miller clamp function and eliminates external resistors coupled to high power drive device 108 described above. In at least one embodiment, gate driver 420 integrates other fault detection circuits described above (not shown).

In at least one embodiment of gate driver 420, driver controller 404 configures variable strength driver 402 to source current according to a normal turn-on profile in response to control signal CTL transitioning from a first value to a second value, configures variable strength driver 402 to sink current according to a normal turn-off profile in response to control signal CTL transitioning from the second value to the first value, or configures variable strength driver 402 to implement a soft-shutdown turn-off profile in response to control signal CTL having the second value and in response to a fault condition (e.g., a desaturation fault condition indicated by control signal FAULT). Exemplary turn-on, turn-off, and soft shutdown turn-off profiles are described above, although other profiles are used in other embodiments. The profiles independently determine values used by driver controller 404 to generate control signals using predetermined digital codes. Predetermined digital codes and other configuration parameters may be preloaded into memory 410, received from a serial interface of driver product 400, or provided to working registers of gate driver 420 or memory 410 using other techniques.

In at least one embodiment, driver controller 404 receives control signal CTL from a primary-side integrated circuit across the isolation barrier and receives a feedback signal from comparator 406, which in some embodiments is a hysteretic comparator. In at least one embodiment, comparator 406 receives a predetermined signal level from digital-to-analog converter 412. In at least one embodiment, the predetermined signal level code is stored digitally in memory 410 as part of a turn-on profile or turn-off profile and later converted to an analog signal for use by comparator 406. In other embodiments, instead of using an analog comparator, an analog-to-digital converter digitizes a level of a signal on terminal VO and digital comparison logic or driver controller 404 generates feedback signal FB, which is indicative of the comparison of gate-to-source voltage $V_{GS}$ of high-power drive device 108 to a predetermined threshold voltage of a turn-on or turn-off profile. In at least one embodiment of secondary-side circuit 403, at least one set of digital codes retrieved from memory 410 corresponds to a target current set point of a variable current drive profile. Driver controller 404 accesses those digital codes to set the output current, gate current IGATE, provided by variable strength driver 402 to the gate of high-power drive device 108 according to the variable current drive profile.

Figure 6:
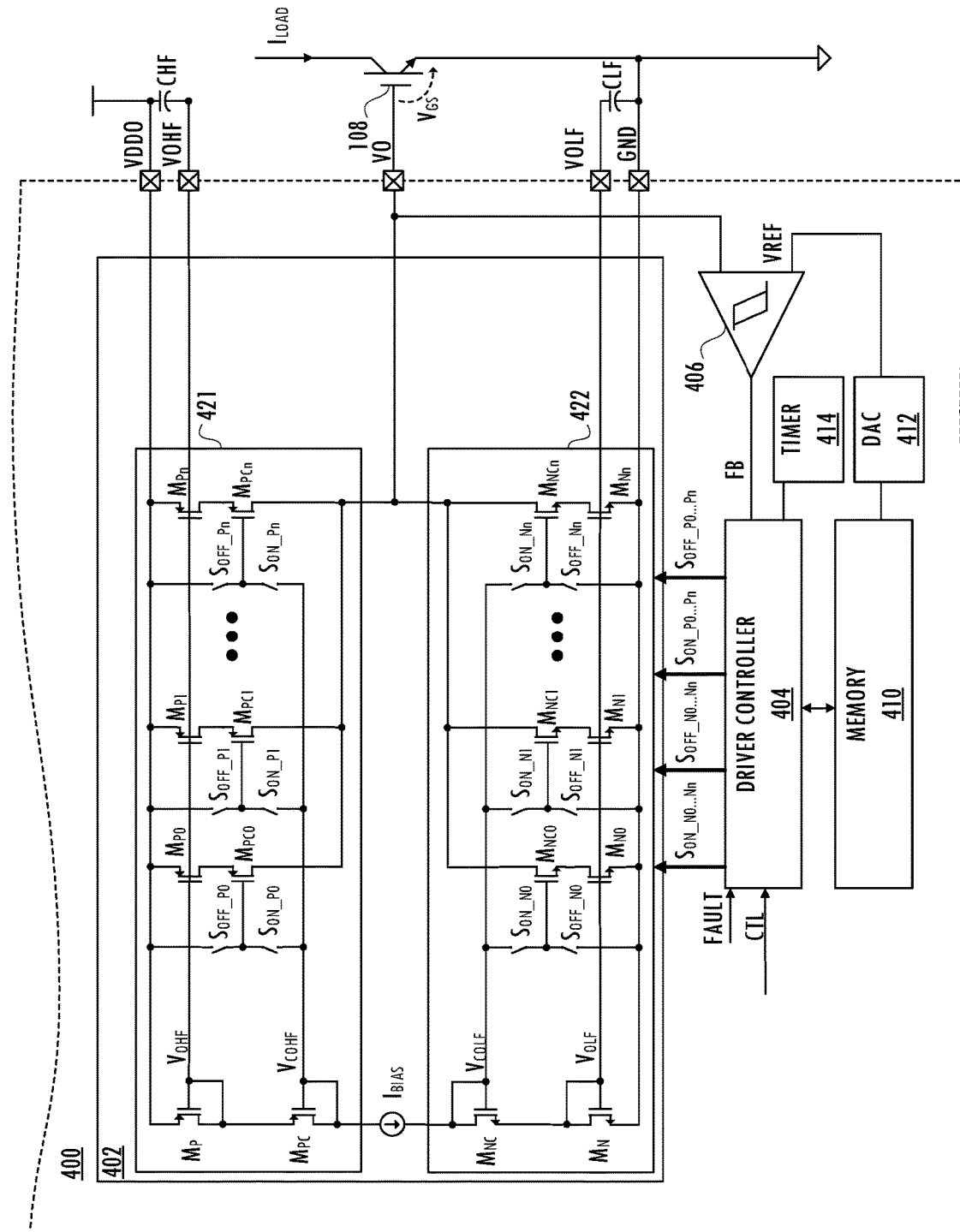
FIG. 6 illustrates a circuit diagram of an exemplary embodiment of a variable current driver circuit consistent with at least one embodiment of the invention.

Referring to FIG. 6, in at least one embodiment of gate driver 420, variable strength driver 402 is a variable current driver including current sources that generate gate current IGATE and corresponding voltages described above. In at least one embodiment, the current sources are implemented using current digital-to-analog converter (DAC) 421 and current DAC 422. Current DAC 421, which sources current to terminal VO in the turn-on process, is realized using p-type transistors. Current DAC 422, which sinks current from terminal VO in the turn-off process is realized with n-type transistors. Current DAC 421 and current DAC 422 each include a current-mirror structure with a fixed current input leg (e.g., transistors $M_P$ and $M_{PC}$ of current DAC 421 and $M_N$ and $M_{NC}$ of current DAC 422) and an output stage including binary-weighted branches or thermometer-weighted branches (e.g., branch including transistors $M_{P0}$ and $M_{PC0}$, branch including transistors $M_{P1}$ and $M_{PC1}$, ..., branch including transistors $M_{Pn}$ and $M_{PCn}$ of current DAC 421 and branch including transistors $M_{N0}$ and $M_{NC0}$, branch including transistors $M_{N1}$ and $M_{NC1}$, ..., branch including transistors $M_{Nn}$ and $M_{NCn}$ of current DAC 422). Corresponding switches (e.g., switches $S_{OFF\_P0}$, $S_{ON\_P0}$, $S_{OFF\_P1}$, $S_{ON\_P1}$, ..., $S_{OFF\_Pn}$, and $S_{ON\_Pn}$ of current DAC 421 and switches $S_{OFF\_N0}$, $S_{ON\_N0}$, $S_{OFF\_N1}$, $S_{ON\_N1}$, ..., $S_{OFF\_Nn}$, and $S_{ON\_Nn}$ of current DAC 422) selectively enable branches of an output stage according to a target current $I_{SET}$. An exemplary manufacturing process provides transistors having different breakdown voltages by forming gate terminals using oxide layers of different thicknesses. An exemplary high-voltage device has a thicker gate oxide and therefore has a higher breakdown voltage than a low-voltage device that has a thinner gate oxide thickness. In at least one embodiment of variable strength driver 402, rather than using high-voltage transistors to interface to the high-voltage domain, low-voltage transistors are used to increase accuracy of the current provided to terminal VO. Low-voltage devices $M_{P0}$, ..., $M_{Pn}$ and $M_{N0}$, ..., $M_{Nn}$ are protected from high-voltages on terminal VO by corresponding cascode devices and provide an accurate output current to the gate of high-power drive device 108 independently from the wide range of voltages on terminal VO. Although each branch of the output stage includes a transistor and a selectively enabled cascode transistor, in other embodiments different numbers of transistors and branch topologies are used.

In an exemplary embodiment of variable strength driver 402, a maximum output current requirement is 12.4 A and is produced by a 5-bit (i.e., n=0, 1, 2, ..., 4) current mirror digital-to-analog converter circuit with an input bias current $I_{BIAS}$ of 1.24 mA, and having a current gain of 10,000. The least significant bit of the binary-weighted digital-to-analog converter circuit corresponds to a current of 0.4 A. Transistors that are sized to generate that high output current create a large transient on the diode-connected input reference transistors $M_P$ or $M_N$ that generates the reference voltages $V_{OHF}$ and $V_{OLF}$ for the each digital-to-analog converter circuit each time the digital input control code is updated. Therefore, variable strength driver 402 includes reservoir capacitor CHF and reservoir capacitor CLF coupled in parallel with diode-connected transistor $M_P$ of DAC 421 and diode-connected transistor $M_N$ of DAC 422, respectively, to reduce or eliminate DAC voltage reference glitches during transitions of the output current. In at least one embodiment of variable strength driver 402, the binary-weighted or thermometer-weighted branches of DAC 421 and DAC 422 are constructed out of a plurality of smaller individual devices that sum up to a target output device size. That structure reduces the impact of semiconductor manufacturing faults on the overall functionality of the output stage. In at least one embodiment, the DAC structure of the output stage and the least-significant bit size are selected to reduce the effect of a single failure.

In at least one embodiment, variable strength driver 402 is coupled to driver controller 404 and memory 410 or other control logic and associated memory, which store variable current drive working registers. In at least one embodiment, driver controller 404 controls the turn-on and turn-off processes based on the contents of memory 410 and parameter inputs. For example, the driver controller circuit generates digital control signals to configure variable strength driver 402 according to the target current level of an active phase of a multi-phase transition process and associated contents of the working registers. In at least one embodiment, driver controller 404 executes a state machine that updates the digital control signals to configure or reconfigure variable strength driver 402 to implement the various phases of the multi-phase transition process based on indicators of parameters (e.g., a sensor output indicative of a voltage level or a current level, a timer output indicative of elapsed time, or an indication of another parameter) and predetermined parameter values (e.g., target signal levels, threshold voltage, or time limit values) stored in memory. In at least one embodiment, a fast voltage comparator is external to a driver controller circuit and provides a parameter indicator, e.g., a feedback signal indicative of a comparison of the gate-to-source voltage $V_{GS}$ to a predetermined threshold voltage. In at least one embodiment, a high-resolution counter included in timer circuit 414 external to driver controller circuit 404 provides time information.

In general, a package of an exemplary isolated gate driver product maintains an isolation barrier between two voltage domains and transfers heat generated by the enclosed die to the circuit board or surrounding air. A conventional isolated gate driver coupled to external gate resistors dissipates power generated during the turn-on process or turn-off process of the high-power drive device using the external gate resistors and internal resistance of the gate driver. The internal resistance of the conventional isolated gate driver is typically substantially smaller than the external gate resistance, causing the external gate resistors to dissipate most of the power. In at least one embodiment of a driver product, the elimination of external gate resistors increases the amount of power dissipated by a gate driver integrated circuit. The isolation barrier requirements impose an increased distance between pins on opposite sides of the isolation barrier and an exposed paddle (e.g., a thermally conductive plate or metal pad external to a package) or other heat sink structure. Thus, the isolation barrier or power dissipation specifications may require a custom-designed package, which increases cost. In the absence of external gate resistors, or if smaller external gate resistance is used, the gate driver integrated circuit dissipates a substantial portion of the power required to turn-on or turn-off the high-power drive device. When driving high-power drive devices, the power dissipation capability of the gate driver integrated circuit may limit packaging options to those packages that include enhanced power dissipation features, e.g., an exposed paddle. Use of enhanced power dissipation features on a package that also maintains an isolation barrier increases the size of package, may require a custom-designed package, and thus, increases cost of the driver product.

A multi-die, distributed package technique addresses power dissipation requirements for a driver product based on the size and associated power dissipation needs of the high-power drive device used in the target application. In at least one embodiment of a driver product, multiple die are distributed across multiple packages, e.g., one package provides galvanic isolation and at least one other package dissipates power of the variable strength driver circuit. FIGS. 7, 8, 9A, and 9B illustrate exemplary embodiments of the multi-die, distributed package technique.

Figure 7:
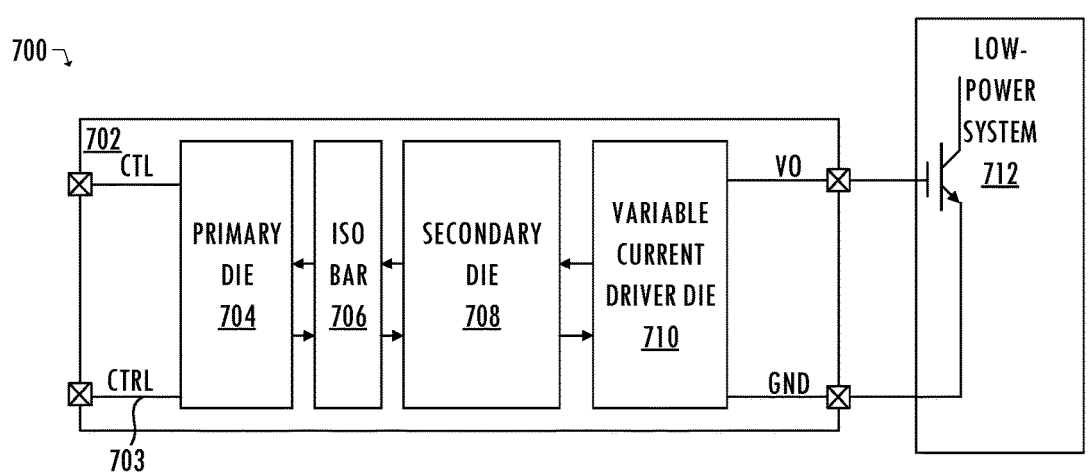
FIG. 7 illustrates a functional block diagram of exemplary packaging of a driver product for a low-power system consistent with at least one embodiment of the invention.

In at least one embodiment of a low-power driver product, two integrated circuit die implement low-voltage control and galvanic isolation, and a third integrated circuit die includes the variable strength driver. All three die reside in the same package and modest thermal conductivity requirements for the low-power driver applications are achieved without an exposed-paddle package. Referring to FIG. 7, in at least one embodiment, driver product 700 includes package 702, which houses primary side integrated circuit die 704, isolation barrier 706, secondary side integrated circuit die 708 and variable current driver integrated circuit die 710. Primary-side integrated circuit die 704 is isolated from secondary-side integrated circuit die 708 by isolation barrier 706. Primary-side integrated circuit die 704 receives control signal CTL (e.g., a pulse-width modulated control signal) from the host controller (not shown in FIG. 7) and communicates the received control signal to secondary-side integrated circuit die 708 across isolation barrier 706. Variable current driver die 710 drives low-power system 712 according to the control signal. Primary-side integrated circuit die 704 exchanges configuration, status, and control signaling CTRL with the host controller and communicates the configuration, status, and control signaling to the secondary-side integrated circuit die 708, which exchanges required configuration, status, and control signaling with the variable current driver die 710.

Low-power system 712 includes a small-sized high-power drive device, e.g., a high-power drive device used in low-power applications. Thus, a single package is sufficient to maintain the isolation barrier and to dissipate the power generated by the gate driver low-voltage control functions and variable current drive of the gate driver in low-power system 712. Relatively small high-power drive devices have low input capacitance $C_{GATE}$. The power dissipated by variable current driver die 710 is relatively low and one low-cost package including standard power dissipation features is sufficient to provide an isolation barrier and power dissipation for primary-side integrated circuit die 704, secondary-side integrated circuit die 708, and variable strength driver die 710. Signaling between the secondary integrated circuit die 708 and variable current driver die 710 includes the PWM signaling, which indicates the target on or off state for the external high-power drive device, and additional configuration, status and control signaling required between secondary integrated circuit die 708 and variable current driver die 710. In at least one embodiment of driver product 700, these signal connections remain within the package.

Figure 8:
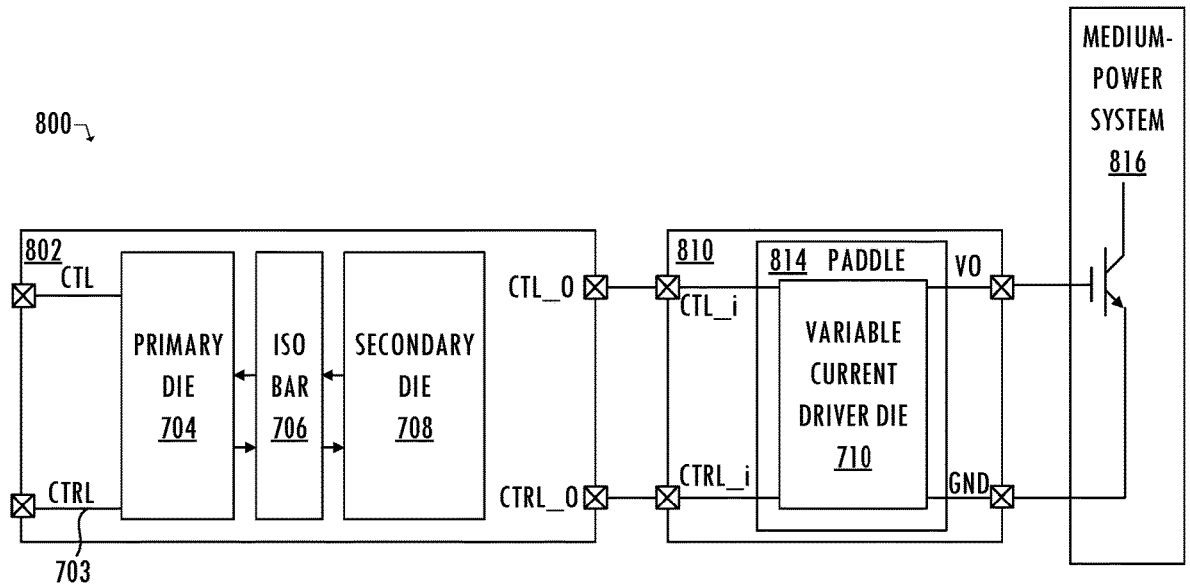
FIG. 8 illustrates a functional block diagram of exemplary packaging of a driver product for a medium-power system consistent with at least one embodiment of the invention.

In at least one embodiment, a driver product uses two packages to house the integrated circuit die that provide isolation and drive capabilities to a medium-size high-power drive device in an application that consumes more power than a low-power application. A first package houses the integrated circuit die that provide isolation and low-voltage control functions. The first package maintains the isolation barrier and does not have demanding thermal conductivity requirements. A second package having enhanced power dissipation characteristics (e.g., exposed paddle or external metal pad) houses the variable current driver die. Referring to FIG. 8, medium-power system 816 includes a medium-sized high-power drive device that has a medium-sized input capacitance $C_{GATE}$. In this embodiment, a substantial amount of power is dissipated by variable current driver die 710 and may not be appropriately conducted by a package without enhanced power dissipation features. In at least one embodiment of driver product 800, package 802 is a low-power package including standard power dissipation features and houses isolation barrier 706, primary-side integrated circuit die 704, and secondary-side integrated circuit die 708. Package 810 includes enhanced power dissipation features and houses variable current driver die 710. In this two-package implementation, received control signal CTL and configuration, status, and control signaling CTRL between secondary-side integrated circuit die 708 and variable current driver die 710 use external package pins and external coupling (CTRL_0 and CTRL_i). In at least one embodiment of driver product 800, the signaling uses parallel logic signals, a serial communication protocol (e.g., SPI bus), or combination thereof. In at least one embodiment of driver product 800, to improve conducted and radiated immunity and to reduce conducted and radiated emissions, differential signaling is utilized for the signaling between packages, although single-ended signaling may be used in other embodiments.

Figure 9A:
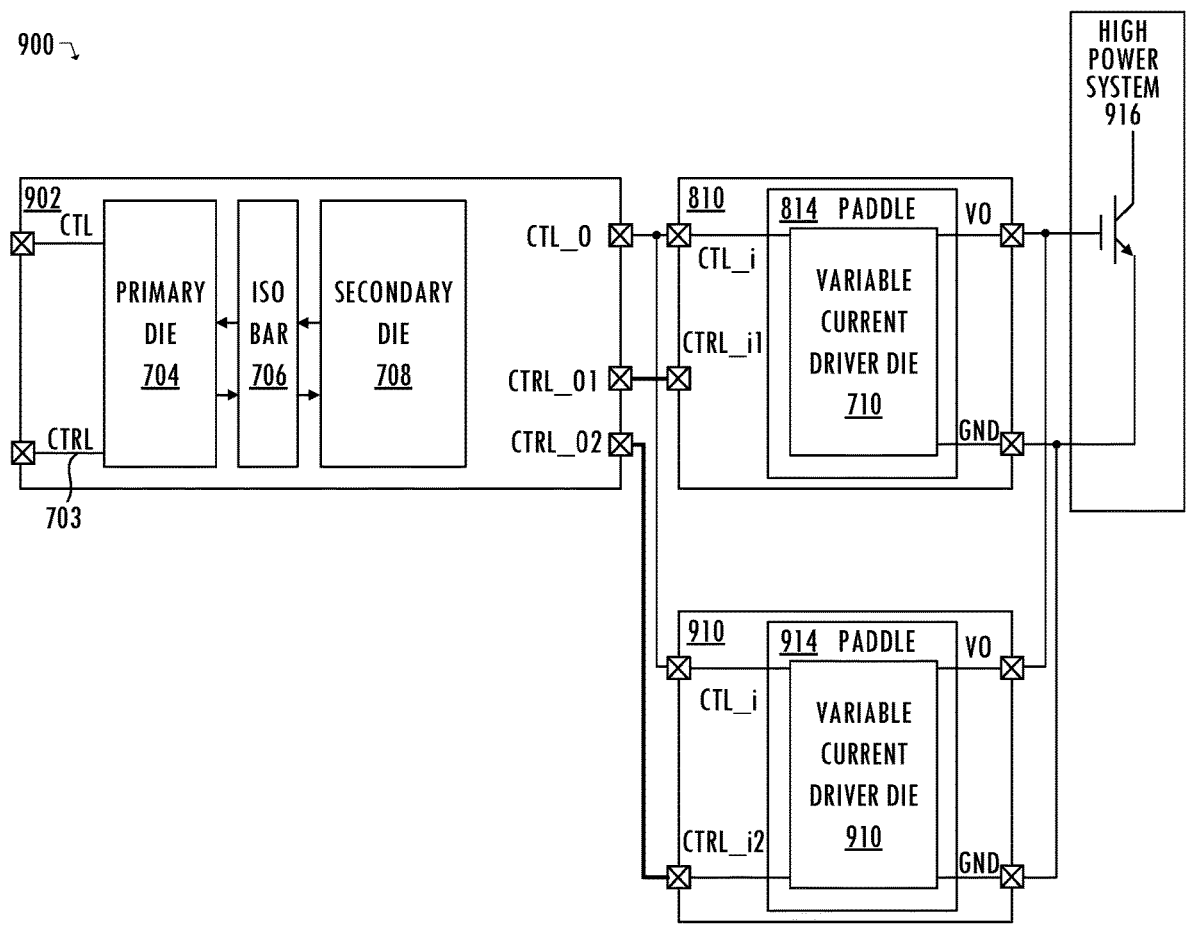
FIG. 9A illustrates a functional block diagram of exemplary packaging of a driver product for a high-power system consistent with at least one embodiment of the invention.
Figure 9B:
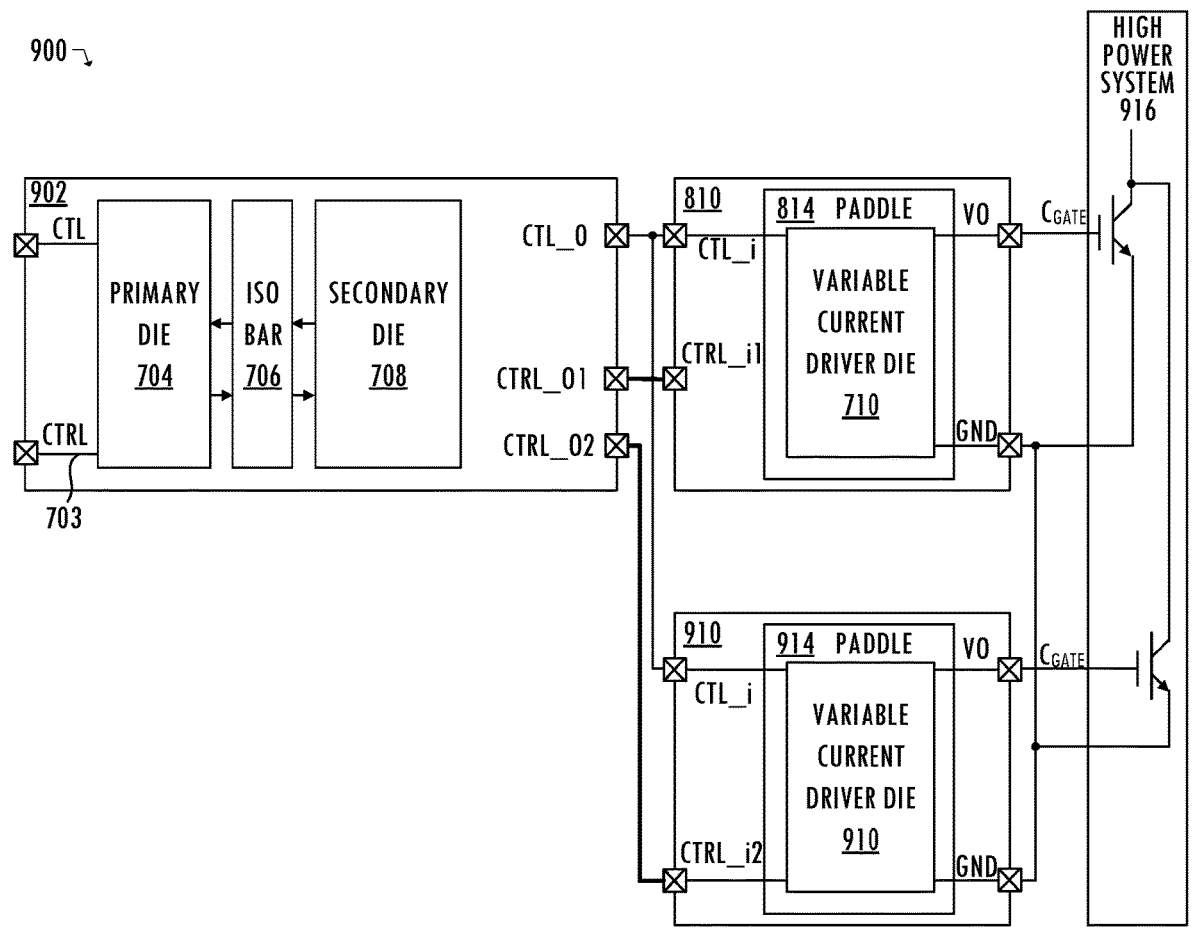
FIG. 9B illustrates a functional block diagram of exemplary packaging of a driver product for a high-power system having redundancy consistent with at least one embodiment of the invention.

In at least one embodiment, a driver product drives large-sized high-power drive devices using a first package housing integrated circuit die that provide isolation and low-voltage control functions, and two or more power-dissipation-enhanced packages that house corresponding variable strength driver stages that are coupled in parallel. Referring to FIG. 9A, driver product 900 includes high-power system 916, which includes a relatively large-size high-power drive device that has a relatively large input capacitance $C_{GATE}$. The power dissipated by variable current driver die 710 may exceed the capabilities of package 810, which includes paddle 814 to enhance power dissipation capability. At least one additional package including paddle 914 houses variable current driver die 910, which is another instantiation of the variable current driver die. Variable current driver die 710 and variable current driver die 910 are configured to drive a high-power drive device in parallel in high-power system 916. Referring to FIG. 9B, rather than couple variable current driver die 810 and variable current driver die 910 in parallel, configuring variable current driver die 810 and variable current driver die 910 to separately drive corresponding high-power drive devices that are coupled in parallel in high-power system 916 provides redundancy in the event that one of the variable current driver die is shorted to ground. The use of two or more variable strength driver die in separate packages, provides redundancy that enables operation at a reduced system power level in response to a failure of a high-power drive device in high-power system 916. Referring to FIGS. 9A and 9B, in addition to enhancing power dissipation capabilities, separation of the variable current driver die into separate high-power packages positioned closer to the corresponding high-power drive device reduces the gate current loop. The multi-die, distributed packaging technique using two or more packages reduces system cost, while providing a variable strength drive solution for various levels of system power requirements.

The variable current drive technique that uses a variable strength driver and associated control that partitions a transition process (i.e., a turn-on process or a turn-off process) of the high-power drive device into a multi-phase transition process having multiple phases that can have different driver settings has significant advantages. The use of variable current drive reduces or eliminates the need for external gate resistors for control of turn-on and turn-off transitions. The use of multiple current settings during turn-on or turn-off of a high-power drive device improves the turn-on and turn-off processes (e.g., improves efficiency, reduces EMI, or reduces drain-to-source voltage VDS and gate-to-source voltage $V_{GS}$ voltage stress) as compared to a conventional gate driver approach. The reduction or elimination of external gate resistors allows the gate driver circuit to be positioned closer to the high-power drive device, thereby reducing inductance and area of a gate loop (i.e., the area enclosed by the gate current loop). Reducing the inductance of the gate loop can reduce ringing of the gate signal. Reducing the area of the gate current loop can reduce radiated emissions and can improve the radiated immunity of the circuit. The variable current drive technique and scalable packaging solutions use fewer pins and fewer external components than other techniques that use a gate driver with multiple outputs for turn-on and multiple outputs for turn-off of the high power drive device.

Gate driver parameter values specify the operating characteristics of the gate driver as explained above, e.g., with relation to FIG. 4. In many applications, it may be desirable to change these parameter values during operation in order to optimize system performance as operating environment characteristics (e.g., high-voltage battery/supply voltage, operating temperature, motor rpm, required motor torque, etc.) change. However, gate drivers for high-power switching devices operate in an environment with high levels of conducted electrical noise and radiated electro-magnetic interference. For gate drivers with programmable control parameters, this high-noise operating environment can limit the ability to perform control parameter updates using serial or parallel bus communications during operation, and/or can corrupt the control parameter values during the update process. For example, in applications such as automotive traction inverters or industrial motor drive circuits, gate drivers control fast switching of large load currents from high-voltage supplies. Fast switching of large currents results in both conducted electrical and radiated electro-magnetic noise in the application circuit. Further, fast switching of high voltages subject the "high-side" gate drivers in half-bridge or full-bridge circuits to additional electrical noise in the form of high common-mode transient voltage events. The resulting electrical noise and electro-magnetic interference present in these applications can corrupt the communication of parameter value updates during operation.

Embodiments described herein provide a comprehensive and scalable approach to achieving efficient and error-free gate driver parameter value updates of a programmable gate driver during switching operation. Embodiments described herein reduce the amount of serial or parallel bus communications required to achieve parameter value updates during operation and also allow parameter value updates during operation without requiring serial or parallel bus communications. In various embodiments, updates during operation can be commanded using (1) serial or parallel bus communications for both configuration and control, (2) using "hardware pin control" (no serial or parallel bus communication required for configuration or control), or (3) using a hybrid approach that utilizes serial or parallel bus communication for configuration, and "hardware pin control" to command (control) updates during operation. Various embodiments are described that are applicable in systems in which serial or parallel bus communications are available during both configuration and operation; in which serial or parallel bus communications are available during configuration but not during operation; and in which neither serial nor parallel bus communications are available for updating of gate driver parameter values.

The description herein utilizes the Serial Peripheral Interface (SPI) bus to exemplify "serial or parallel bus communications" but other serial or parallel buses can be used in various embodiments. A host SPI bus (or other bus) provides an interface between the host controller and the low voltage side of the isolation channel. For example, an SPI bus provides a communication interface between the host controller 100 (see FIG. 1) and the primary die 704 (see FIGS. 7-9B). In embodiments, the SPI bus forms at least part of the CTRL input/output 703 on primary die 704 in FIGS. 7-9B. The communication over the isolation communication channel may utilize an SPI protocol or another protocol. For example, with reference to FIGS. 7-9B, the primary die 704 communicates with the secondary die 708 over the isolation communication channel. Some embodiments may have a single die (a combination of the secondary die 708 and the variable current driver die 710) on the output side of the isolation barrier (high side). For embodiments with multiple die on the output side, the secondary die 708 communicates with the variable current driver die 710 (and 910 if present) over an output side communication bus, which may implement the SPI or another bus protocol.

In embodiments, the bus used for configuring and updating gate driver parameters values over the isolation communication channel is separate from the isolation communication channel communicating the pulse wave modulated (PWM) CTL signal controlling the ON and OFF cycle (see FIG. 4) for the gate signal. Thus, the communication channels shown between the primary die 704 and the secondary die 708 may comprise multiple isolation communication channels in one or both directions. In other embodiments, a single isolation communication channel exists that is used only for configuration and not updates as described further herein. In still other embodiments, updates to gate driver parameter values are embedded in the PWM CTL signal sent over the isolation communication channel.

The parameters associated with the variable-current-drive gate driver described above in an automotive traction inverter application are used to exemplify parameters of a gate driver that may need to be updated during switching operations. While an automotive traction inverter application is used herein as an example, the approaches described herein can be applied to gate drivers in applications where it is advantageous to dynamically update operating parameters during operation.

As described, e.g., in FIG. 4, the variable current drive (VCD) gate driver subdivides the turn-on and turn-off processes into multiple phases that have independent characteristics such as current levels, threshold voltages, and time limits. The VCD implementation used in the embodiment of FIG. 4 uses a 2-phase turn-on process, a three-phase turn-off process, and two three-phase "soft shut-down" processes (a soft shut-down process is a special case of the turn-off process that is used under particular fault conditions).

Figure 10A:
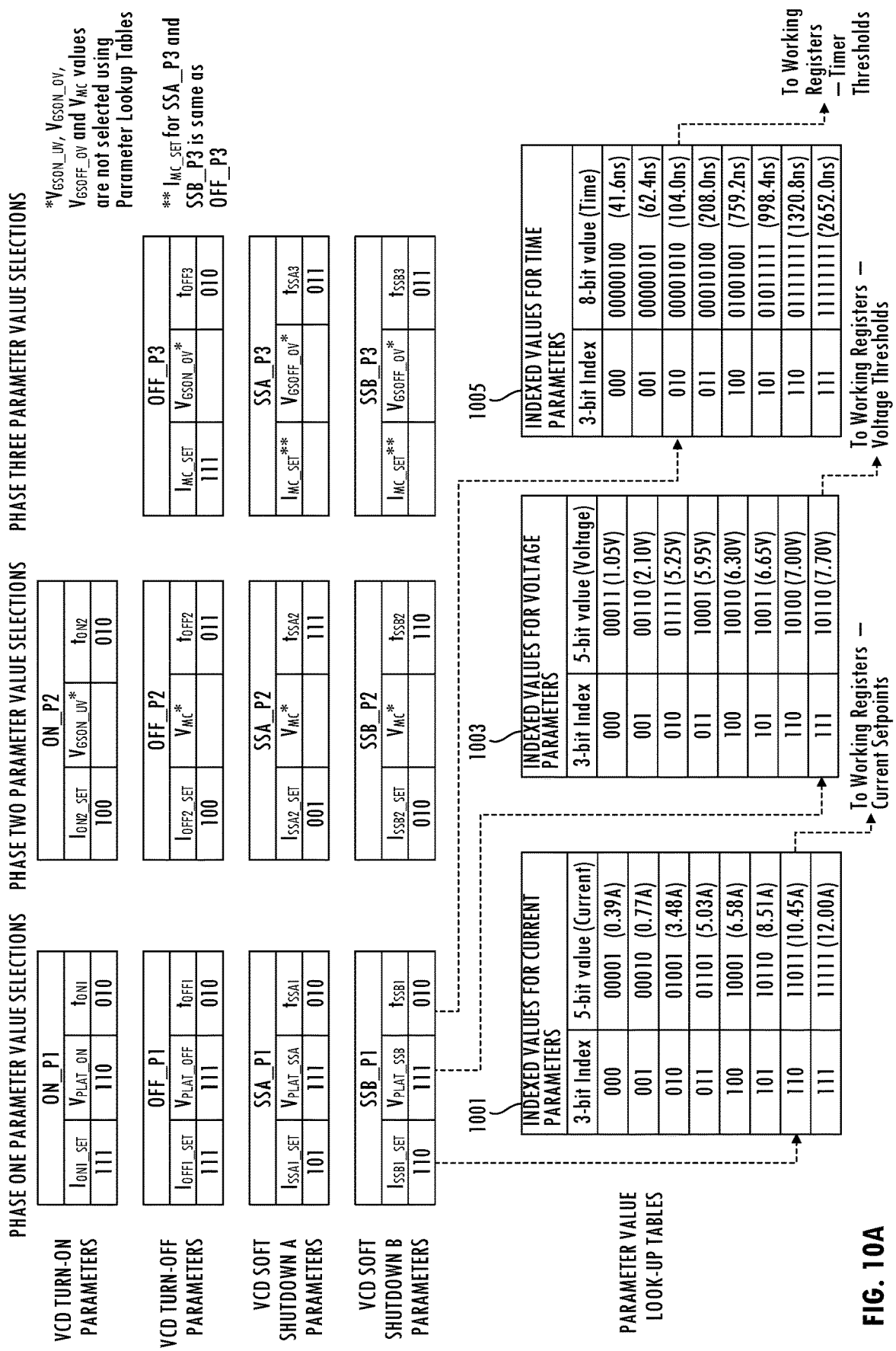
FIG. 10A illustrates VCD and parameter values mapping to lookup tables consistent with at least one embodiment of the invention.

FIGS. 10A and 10B illustrate how at least one embodiment specifies parameters for a two-phase turn-on process, a three-phase turn-off process, and a three-phase soft shut-down process (special case of the turn-off process that is used under particular fault conditions) described above, although other embodiments use other numbers of phases for turn-on, turn-off, or soft-shutdown. FIGS. 10A and 10B illustrate specifying variable current drive parameter values for operating the gate driver in an exemplary automotive traction inverter application. Phase one of the VCD turn-on process, for example, is controlled by the "Turn-On Phase 1" (ON_P1) parameters: $I_{ON1\_SET}$, $V_{PLAT\_ON}$, and $t_{ON1}$. Phase two of the turn-on process is controlled by the "Turn-On Phase 2" (ON_P2) parameters: $I_{ON2\_SET}$, $V_{GSON\_UV}$, and $t_{ON2}$. Phase one of the VCD turn-Off process, for example, is controlled by the "Turn-Off Phase 1" (OFF_P1) parameters: $I_{OFF1\_SET}$, $V_{PLAT\_OFF}$, and $t_{OFF1}$. Phase two of the turn-Off process is controlled by the "Turn-Off Phase 2" (OFF_P2) parameters: $I_{OFF2\_SET}$, $V_{MC}$, and $t_{OFF2}$. Phase three of the turn-Off process is controlled by the "Turn-Off Phase 3" (OFF_P3) parameters: $I_{MC\_SET}$, $V_{GSON\_OV}$, and $t_{OFF3}$. FIG. 10A shows two sets of soft shut down parameters, VCD Soft Shutdown A parameters and VCD Soft Shutdown B parameters. Phase one of the Soft Shutdown SSA process is controlled by the "SSA Phase 1" (SSA_P1) parameters: $I_{SSA1\_SET}$, $V_{PLAT\_SSA}$, and $t_{SSA1}$. Phase two of the Soft Shutdown SSA process is controlled by the "SSA Phase 2" (SSA_P2) parameters: $I_{SSA2\_SET}$, $V_{MC}$, and $t_{SSA2}$. Phase three of the Soft Shutdown SSA process is controlled by the "SSA Phase 3" (SSA_P3) parameters: $I_{MC\_SET}$, $V_{GSOFF\_OV}$, and $t_{SSA3}$. FIG. 10A also illustrates the parameters used for the VCD Soft Shutdown B parameters. Phase one of the Soft Shutdown SSB process is controlled by the "SSB Phase 1" (SSB_P1) parameters: $I_{SSB1\_SET}$, $V_{PLAT\_SSB}$, and $t_{SSB1}$. Phase two of the Soft Shutdown SSB process is controlled by the "SSB Phase 2" (SSB_P2) parameters: $I_{SS2\_SET}$, $V_{MC}$, and $t_{SSB2}$. Phase three of the Soft Shutdown SSB process is controlled by the "SSB Phase 3" (SSB_P3) parameters: $I_{MC\_SET}$, $V_{GSOFF\_OV}$, and $t_{SSB3}$. Note that embodiment shown in FIG. 10A includes two sets of soft shutdown parameters, VCD Soft Shutdown A parameters and VCD Soft Shutdown B parameters. The normal turn off parameters are generally set to turn off as fast as possible without the switching off of the maximum current specified for the switching device generating a flyback voltage large enough to damage the switch. As explained above, under fault conditions, like DESAT, the current in the switch may exceed the normal maximum operating current, so soft shutdown slows down the turn off (di/dt) to avoid generating a correspondingly higher induced voltage that could damage the switch. Embodiments also provide the ability to sense multiple levels of overcurrent (i.e., "overcurrent fault" and "short-circuit fault") when power switching devices with a "current mirror" output are used. The two different soft shutdown options (VCD Soft Shutdown A parameters and VCD Soft Shutdown B parameters) correspond to those two different fault conditions (overcurrent fault and short-circuit fault). Other embodiments detect a single overcurrent condition and have only one set of soft shutdown parameters.

In the embodiments of FIGS. 10A and 10B, a stored set of parameter values for a single phase of the turn-on or turn-off process (e.g., ON_P1 or SSB_P1) is referred to as a "Profile Component". A complete set of Profile Components, representing values for ON_P1, ON_P2, OFF_P1, OFF_P2, OFF_P3, SSA_P1, SSA_P2, SSA_P3, SSB_P1, SSB_P2, and SSB_P3, is referred to as a VCD "Profile". The operating characteristics of the VCD Gate driver are controlled by the values that are loaded into the VCD "Working Registers" 1007, 1009, and 1011 shown in FIG. 10B. The VCD Working Registers contain a complete set of Profile Components, i.e. one complete Profile.

FIGS. 10A and 10B depict one approach for efficiently representing the VCD profile components. To allow efficient updates of the Working Register values, the parameters are specified as indices into "look-up tables" that include indexed values for current parameters 1001, indexed values for voltage parameters 1003, and indexed values for time parameters 1005. Referring to FIG. 10B, the selected table values are then loaded into the VCD Working Registers 1007, 1009, and 1011. In the example of FIG. 10B the working registers include timer threshold working registers 1007, voltage threshold working registers 1009, and current setpoint working registers 1011. During operation, the multiphase transition process of the high-power drive device is controlled, at least in part, using the parameter values stored in the VCD working registers. In the example of FIGS. 10A and 10B, the parameters of the Profile Components are 3-bit indices that select 5-bit or 8-bit values from the lookup tables, which are then loaded into the VCD Working Registers as illustrated for the parameters $I_{SSB1}$, $V_{PLAT\_SSB}$, and $t_{SSB1}$ of the Profile Component SSB_P1. In the embodiment of FIGS. 10A and 10B $V_{GSON\_UV}$, $V_{GSON\_OV}$, $V_{GSOFF\_UV}$, $V_{GSOFF\_OV}$ and $V_{MC}$ values are not selected using VCD Parameter Lookup Tables. Instead, the values are programmed using separate registers for which there is no requirement for updating during operation. Other embodiments may choose to update some or all of those values during operation and therefore utilize the VCD parameter lookup tables. Note also that $I_{MC\_SET}$ for SSA_P3 and SSB_P3 is same as the $I_{MC\_SET}$ parameter value used in OFF_P3.

In the example shown in FIG. 10A, the parameters values for SSB_P1 point to the actual parameter values in the associated parameter value tables, as illustrated for the $I_{SSB1\_SET}$, $t_{SSB1}$, and $V_{PLAT\_SSB}$ parameters of "Soft Shut-Down B Phase 1" (SSB_P1). The index value 110 for SSB_P1, $I_{SSB1\_SET}$ points to a five bit value 11011 in lookup table 1001, which value corresponds to 10.45 A. The index value 111 for $V_{PLAT\_SSB}$ points to a five bit value 10110 in lookup table 1003, which value corresponds to 7.70V. Finally, the index value 010 for $t_{SSB1}$ points to an eight bit value 00001010 in lookup table 1005, which value corresponds to 104.0 ns. As shown in FIG. 10B, the values from the lookup tables are loaded into the working registers 1007, 1009, and 1011. The use of index values allows less information to be transmitted during operation. While 3 bit index values are shown by way of example, the size of each index is determined by the size of the parameter value lookup table appropriate for the application. The values used to specify voltages, times, and currents is application dependent and depends on the range and granularity desired for the particular application.

FIGS. 11A and 11B illustrate an example of stored "Profile Components" stored in VCD profile component registers and a mapping of these profile components into VCD Profiles, which allows efficient dynamic control of a VCD gate driver. A stored set of parameter values for a single phase of the turn-on or turn-off process (e.g., ON_P1 or OFF_P3) is referred to as a "Profile Component". A profile component such as ON_P1a and ON_P1b therefore has, e.g., all three 3-bit values for ON_P1. A complete set of Profile Components, representing values for all the phases (ON_P1, ON_P2, OFF_P1, OFF_P2, OFF_P3, SSA_P1, SSA_P2, SSA_P3, SSB_P1, SSB_P2, and SSB_P3) is referred to as a VCD "Profile". FIG. 11A shows profile components ON-P1a, ON-P2a, OFF-P1a, OFF_P2a, OFF_P3a. FIG. 11A also shows profile components ON-P1b, ON-P2b, OFF-P1b, OFF-P2b. Thus, generally there are "a" profile components and "b" profile components. FIG. 11A also shows two different soft shutdown parameter sets SSA and SSB. The "xxx_P3a" parameter controls the characteristics of the Miller clamp function, which really engages only after the turn-off is completed, so in at least some embodiments there is not much need to change these parameters from their default settings for differing environmental conditions. Some applications may utilize alternate settings, but for most applications OFF_P3 uses the default values (here the "a" values), and a "b" version of these parameter values is not needed. Similarly, SSA_P3a and SSB_P3a typically use default values. FIG. 11B shows 16 profiles 0000 to 1111 and how those profiles are mapped to the particular profile components. For each phase of the VCD driver a particular profile component is selected. Thus, e.g., profiles "0000" to "0111" select the profile component ON_P1a. For ON_P2 Profiles "0000" to '0011' select ON_P2a. Profiles "0000" and "0001" select OFF_P1a and profile '0000' selects OFF_P2a and profile "0001" selects OFF_P2b. OFF_P3 and the soft shutdown components for SSA and SSB are the same across the 16 profiles. As mentioned above, the third phase of the shutdown is not typically critical so at least some embodiments always use the same setting for the third shutdown phase (OFF_P3, SSA_P3, and SSB_P3). Of course, other embodiments use different parameter values for OFF_P3, SSA_P3 and SSB_P3, and even define a and b variants for these. While "a" and "b" profile components are shown, embodiments can have a number of different profile components appropriate for the particular application. In addition, while the example of FIG. 11B includes 16 VCD profiles, other embodiments can have more or fewer profiles.

In applications wherein host SPI communications are available during gate driver switching operations, updates to the gate driver VCD Working Register parameter values during operation can be accomplished either by specifying a new VCD Profile to be loaded in its entirety into the VCD Working Registers, or by updating the contents of individual Profile Components, e.g., all or just a portion of ON_P1a.

In applications wherein it is preferable to not use SPI communications during switching operations, or in applications that do not utilize SPI communications, updates to the VCD Working Register values during switching operation can be accomplished using "Pin Control" as described further herein.

Figure 12:
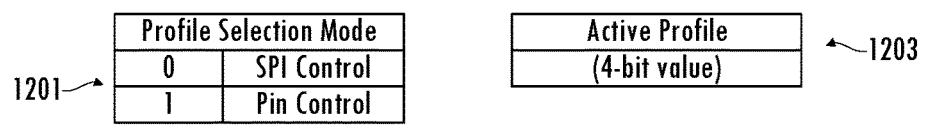
FIG. 12 illustrates an example "Profile Selection Method" register bit and "SPI Profile Selection" register field.

Embodiments provide multiple ways to select one of the profiles shown by way of example in FIG. 11B, to be used during operation. FIG. 12 depicts an example "Profile Selection Mode" register bit 1201 and "Active Profile" register field 1203. The Profile Selection Mode bit specifies whether profile selection will be accomplished using "SPI Control" (i.e. SPI register writes) or using Pin Control. The Active Profile register field 1203 indicates which profile is being used for the VCD Operating Values. When SPI Control is selected, the Active Profile register value is written by the host via the SPI bus. When Pin Control is selected, the Active Profile register value is controlled by the state of the Pin Control input signals.

In a first scenario (Scenario 1), the availability of SPI communications between the VCD gate driver and the gate driver's host controller both during system initialization and during switching operations provides for efficient and error-free gate driver VCD parameter value updates in systems. In embodiments, to facilitate error-free updates, all SPI read and write operations between the host controller and the gate driver include a cyclic redundancy check (CRC) code to ensure error-free SPI communication. Other embodiments use different error coding approaches, e.g., multi-bit error correction instead of, or in addition to, the use of CRC.

Figure 13:
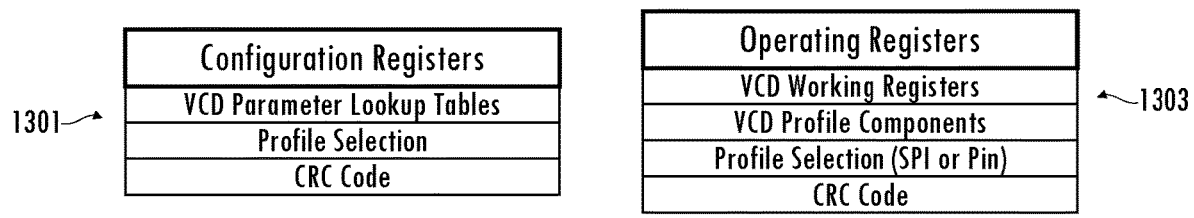
FIG. 13 illustrates an embodiment of the Configuration Registers Block and the Operating Registers Block.

During system initialization, the gate driver is set to "Configuration Mode". When the gate driver is in Configuration Mode, the gate driver output is disabled and the host controller has full access to both the gate driver "Configuration Registers" and the gate driver "Operating Registers" via the SPI interface. The gate driver "Configuration Registers" are those gate driver registers that are writable only in Configuration Mode. The gate driver Operating Registers are those gate driver registers that are writable during switching operations. In an embodiment the Configuration Registers and the Operating Registers reside in a die on the output side of the isolation barrier, e.g., in variable current driver die 710 (and variable current driver die 910 if present) as shown, e.g., in FIGS. 7-9B. FIG. 13 illustrates an embodiment of the Configuration Registers and the Operating Registers.

Both the Configuration Registers and the Operating Registers are populated with "default values" when the gate driver is powered on. The host "configures" the gate driver by writing to the gate driver Configuration Registers and Operating Registers with any desired changes to the default values. The VCD Parameter Value Look-Up Tables 1001, 1003, 1005 depicted in FIG. 10 and the Profile Selection Method register bit 1201 depicted in FIG. 12 are included in the gate driver Configuration Register Block. The gate driver Configuration Register block 1301 includes a CRC code that is calculated and stored each time a Configuration Register value is written. In an embodiment, the host provides a CRC code for the Configuration Register Block each time a Configuration Register value is written and the gate driver generates a CRC for the Configuration Register Block and compares the gate driver generated CRC to the host provided CRC. A handshake mechanism may be used for the host to be assured that the two CRCs match. For example, the gate driver generated CRC for the Configuration Register Block may be stored in a register readable by the host. In other embodiments the CRCs are generated by the host and gate driver after completing update of the Configuration Register Block and then compared by the driver and/or the host.

The VCD Working Registers depicted in FIG. 10B, the VCD Profile Component registers depicted in FIG. 11A, and the Active Profile register field (written by SPI or Pin Control) depicted in FIG. 12 are included in the Operating Register Block 1303. The Operating Register block includes its own CRC code that is calculated and stored each time an Operating Register value is written.

During gate driver configuration, the host controller can replace the default values loaded into the VCD Parameter Value Look-Up Tables with values that are optimized for the specific application, if desired. In an embodiment, the Profile Selection Method defaults to "Pin Control", so where SPI communications are available during both configuration and operation, the host changes this setting to "SPI Control" while in the Configuration Mode (thereby allowing the Active Profile to be selected using SPI communication while in "Operating Mode").

After initialization, the system can proceed to switching operations. During switching operations, the gate driver is set to "Operating Mode". When the gate driver is in Operating Mode, the gate driver output is enabled, and the host controller has full access to the gate driver Operating Registers, but no longer has "write access" to the Configuration Registers. When the gate driver is in Operating Mode, CRC codes for both the Configuration Register block and the Operating Register block are periodically re-calculated and compared to the stored values to verify the register blocks remains error-free (a mismatch between the re-calculated value and the stored value will generate a fault response).

In one or more embodiments, in Operating Mode, the host can affect changes to the VCD Working Register values by performing an SPI write operation to the Active Profile field, or by writing to individual VCD Profile Components within the gate driver Operating Register block. The process of changing the VCD Working Register values during operation is referred to as "VCD control".

In one or more embodiments, in Operating Mode, as in Configuration Mode, both the SPI communication and the Operating register block update are protected by CRC codes. The VCD Working Register values within the gate driver are updated only after verification that an error-free communication has been received.

In an embodiment, as an extra measure of protection, the host controller maintains a mirror image of the gate driver Operating Mode Register Block. In this case, the host controller calculates a CRC code on its locally-stored Operating Mode Register Block mirror image. Comparison of the host-calculated CRC and the gate-driver-calculated CRC can be done in either of two ways. The host can send the host-generated CRC to the gate driver as part of the SPI write cycle and the values will be compared by the gate driver, or the host controller can read back the gate-driver-generated CRC code from the gate driver for comparison.

All updates to the VCD Working Register values are synchronized within the gate driver to the gate driver switching to ensure that parameter changes do not disrupt the switching process. For example, after the error-free receipt of a Profile Component update or a SPI Active Profile update from the host controller, any resulting updates of Turn-On Working Register values will be incorporated after the gate driver switching state changes from the "On State" to the "Off State", thus allowing a full Off State of the switching cycle for the update of the Turn-On Working Register values. Similarly, Turn-Off and/or Soft Shut-Down Working Register updates are done after the gate driver switching state transitions from the Off State to the On State.

Figure 14:
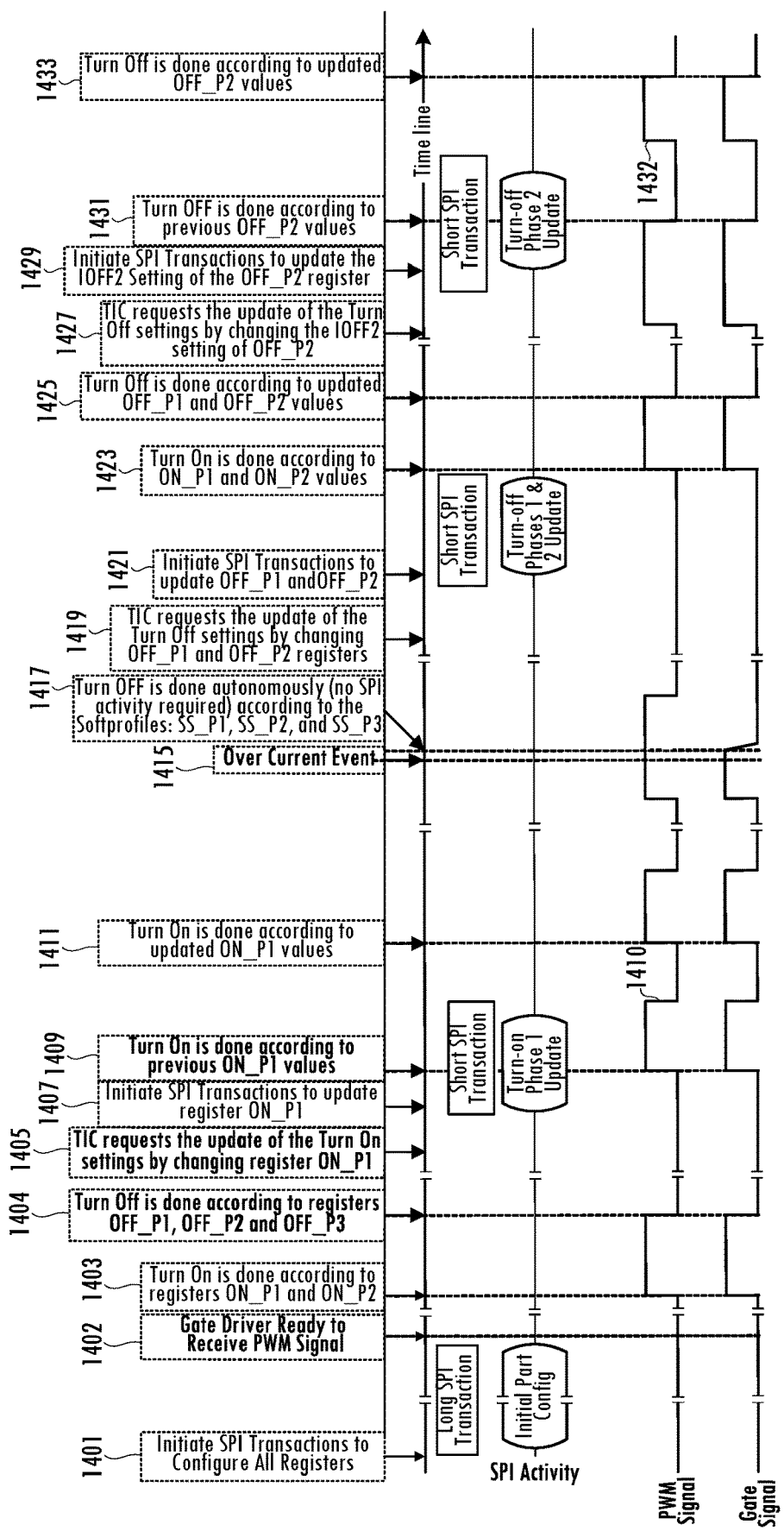
FIG. 14 illustrates an embodiment of the synchronization of VCD Working Register value updates to the PWM On-State/Off-State control.

FIG. 14 depicts the synchronization of VCD Working Register value updates to the PWM On-State/Off-State control. An SPI transaction (i.e., an SPI command sequence) to update Turn-On (Turn-Off) working parameters is received asynchronously to the PWM signal. Internally, updates to On-State working values are done only at PWM On-to-Off transitions, and updates to Off-State working values are done at Off-to-On transitions. At 1401 a long SPI transaction occurs to initially configure the Configuration Registers and the Operating Registers. When the configuration is completed, the gate driver is ready to receive the PWM signal at 1402. At 1403 Turn-On (PWM signal high) is done according the registers ON_P1 and ON_P2. At 1404 Turn-Off (PWM signal low) is done according to the OFF_P1, OFF_P2, and OFF_P3 registers. At 1405, the traction inverter controller (TIC), also referred to herein as the host controller, requests an update to register ON_P1. A short SPI transaction is initiated at 1407. At 1409, because a transition from On-to-Off has not occurred, the Turn-On is done according to previous ON_P1 values. After the transition of the PWM signal to Off at 1410, the next Turn-On at 1411 occurs with the updated ON_P1 values.

An over current event occurs at 1415 resulting in an autonomous Turn-Off at 1417 done according to the soft shutdown parameters. At 1419 the TIC requests an update to the Turn Off settings. A short SPI transaction is initiated at 1421 to update OFF_P1 and OFF_P2 values. Turn-On occurs at 1423 according to ON_P1 and ON_P2. At 1425 Turn-Off uses the updated OFF_P1 and OFF_P2 values since an Off-to-On transition has occurred. At 1427 the TIC requests another update of the Turn-Off settings to change the IOFF2 setting of OFF_P2. At 1429 a short SPI transaction is initiated to update the IOFF2 setting. At 1431, Turn-Off utilizes the previous OFF_P2 values. After the Off-On transition at 1432, the Turn-Off occurs at 1433 according to the updated OFF_P2 values. Note that rather than updating the working registers or profile components individually, the host controller can request a profile change. In that case, Turn-On updates for the selected profile will be applied after an On-To-Off transition and Turn-Off updates will be applied after an Off-to-On transition. In an embodiment the selected profile is applied by updating the corresponding working registers at the appropriate time according to the selected profile components of the profile that are stored in memory.

A second scenario (scenario 2) provides for efficient and error-free gate driver VCD parameter value updates in systems wherein SPI communications are available during configuration but not during operation. In applications where SPI communication with the host controller is available for gate driver configuration, but where it is preferred to suspend SPI traffic during switching operation, VCD Working Register updates during Operating Mode can be accomplished using Pin Control.

In the second scenario, VCD gate driver configuration is the same as described for Scenario 1 except that the Profile Selection Mode bit in the Configuration Register Block remains in the default setting of "Pin Control". In Pin Control mode, the Profile Selection field of the gate driver Operating Register block reflects the state of the "pin control" inputs, and this value is updated on a continuing basis to reflect the state of these inputs. In an embodiment the pin control inputs form part of the CTRL terminals on the primary die 704 shown in FIGS. 7-9B. In this case, the Active Profile field may be excluded from the Operating Register block CRC calculation. In the unlikely event of a bit flip in the Active Profile field, the value will automatically be corrected by the next automatic update (see below). As in scenario 1, the host can change configuration settings such as the VCD Parameter Value Look-Up Table entries and the VCD Profile Component register values. In an embodiment the pins for Pin Control mode are located on the input side die, shown, e.g., as primary die 704 in FIGS. 7-9. With reference to FIGS. 7-9, the primary die 704 reads the values periodically thereby providing an automatic update, e.g., every 100 ms or other interval appropriate for the application and sends the values over the isolation communication channel of the isolation barrier to secondary die 708, which supplies the updated pin value to variable current die 710 (and variable current die 910 if present) over a die-to-die communication bus, e.g., a serial communication bus, on the output side of the isolation barrier. An embodiment of the die-to-die serial communication bus uses differential signaling for each of the bus signals between the die to provide better immunity to noise.

After configuration is completed, the host can set the VCD gate driver to Operating Mode as in Scenario 1. However, in Scenario 2, the host refrains from making SPI register writes while in Operating Mode. In this case, the VCD Working Register value updates are accomplished using the "Pin Control" method of selecting which VCD Profile is to be loaded into the VCD Working Registers.

Figure 15:
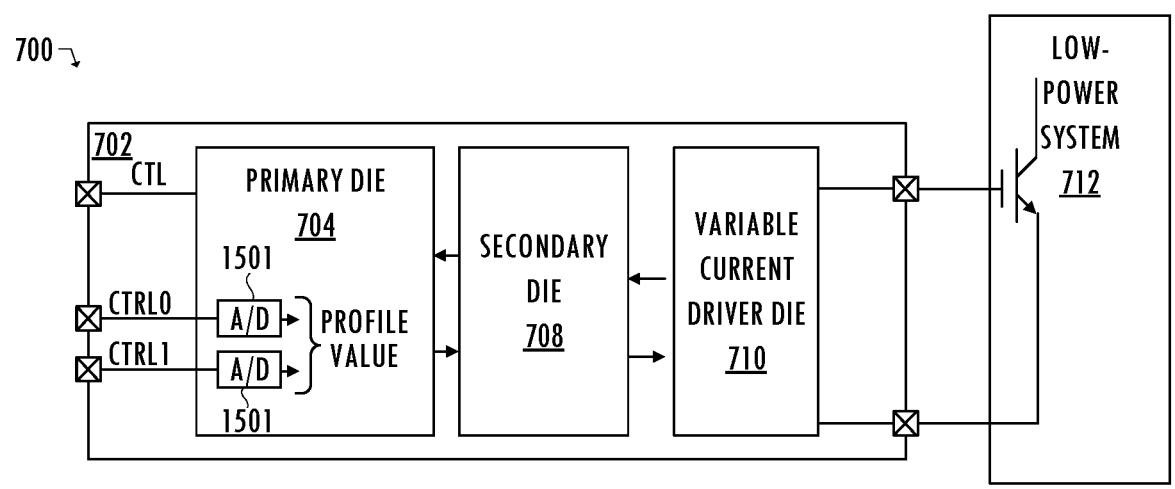
FIG. 15 illustrates an embodiment using two input terminals for pin control.

In the simplest embodiment of Pin Control, separate device pins are used for the SPI signals and for the Pin Control signals. In an embodiment, pin control utilizes four pins to specify one of 16 profiles to use as the Active Profile value shown in FIG. 12. In order to reduce the number of pins required for Pin Control, an embodiment re-uses some of the SPI pins for the host SPI bus for Pin Control when in Pin Control mode. In this case, an SPI command directs the device to switch to Pin Control Mode and this command would disable SPI communication for the duration of the Pin Control Mode. In another embodiment, an analog approach uses, e.g., two pins to receive multi-level voltage values. In an embodiment shown in FIG. 15, analog to digital (A/D) converter(s) 1501 in the primary die 704 convert the voltages present on the pins to digital values. Four voltage levels on each pin allows selection from 16 profiles. Of course, in embodiments using an analog approach, the number of voltage levels and pins varies according to the needs and capabilities of the system.

A third scenario (scenario 3) provides for Efficient and error-free gate driver VCD parameter value updates in systems wherein SPI communications are available neither during configuration nor during operation. Scenario 3 supports applications where SPI is available neither during gate driver configuration nor operation. This is applicable in applications that do not utilize SPI communications between the host and the gate driver. This scenario can also be applied during "hardware bring-up" of applications that will eventually use SPI communications, but where it is desirable to verify operation of the gate driver circuit before host SPI communications are programmed/available.

In this third scenario, the only register configuration of the gate driver is the automatic loading of default values into the Configuration Registers and Operating Registers from non-volatile memory (NVM) when the gate driver is powered on. A hardware (non-SPI) method of configuring the device for "Non-SPI Pin-Control" operation is needed. In an embodiment that configuration is done using a device pin that is pulled to a predetermined state (high or low) at power-on to indicate Non-SPI Pin-Control operation, for example. In an embodiment, configuring the part for Non-SPI Pin-Control mode in this way results in the part automatically entering operating mode after the Configuration Registers and Operating Registers are populated with default values stored, e.g., in non-volatile memory. Writing the Configuration Registers and Operating Registers with default values and then switching to operating mode can be controlled by a state machine, a processor (e.g., a microcontroller) under software control, or any appropriate combination of programmable and other logic. After switching to the operating mode, updates of the VCD Working Register values can be accomplished using pin control to select any of the default VCD Profiles.

The description of the invention set forth herein is illustrative and is not intended to limit the scope of the invention as set forth in the following claims. For example, while embodiments have been described for a driver product used in a motor application using two turn-on phases and three turn-off phases, one of skill in the art will appreciate that the teachings herein to update driver parameters during switching operation can be utilized in other applications and for applications with other numbers of turn-on phases and/or turn-off phases. Variations and modifications of the embodiments disclosed herein, may be made based on the description set forth herein, without departing from the scope of the invention as set forth in the following claims.

What is claimed is:

1. A method comprising:
   updating one or more operating parameters of a gate driver responsive to an update request during an operating mode of the gate driver in which switching operations occur, the one or more operating parameters being updated including one or more turn-on parameters, one or more turn-off parameters, or both the one or more turn-on parameters and the one or more turn-off parameters, the turn-on parameters and the turn-off parameters associated with supplying an output signal supplied by the gate driver to drive a device,
   using the turn-on parameters for a first plurality of turn-on phases for an output signal that is coupled to the device that is driven by the gate driver; and
   using the turn-off parameters for a second plurality of turn-off phases for the output signal, the updating including selecting one of a plurality of profiles as the update request, each of the profiles specifying current, voltage, and time parameters for each phase of the first plurality of turn-on phases and for each phase of the second plurality of turn-off phases.

2. The method of claim 1, further comprising updating during the operating mode, one or more soft shut down parameters, the soft shut down parameters being for a third plurality of soft shutdown phases for shutting down the device being driven by the gate driver.

3. The method of claim 1 wherein the selected one of the plurality of profiles further includes soft shutdown parameters.

4. The method, as recited in claim 1 further comprising:
   setting a control bit during a configuration mode to specify whether to use bus control or pin control during the operating mode; and
   selecting the one of the plurality of profiles using pin control or bus control.

5. The method of claim 1, further comprising using a dedicated pin to specify using default configuration values for configuration registers and for operating registers and to use pin control to select one of a plurality of default profiles during an operating mode and to enter the operating mode after the configuration registers have been loaded.

6. The method of claim 1, further comprising synchronizing the updating of the turn-on parameters and the turn-off parameters with a switching state of the gate driver, the synchronizing providing that changes to any of the turn-on parameters requested by the update request occur responsive to the switching state of the gate driver changing from an on-state to an off-state, and the synchronizing providing that updates to any of the turn-off parameters occur responsive to the switching state of the gate driver changing from the off-state to the on-state.

7. The method comprising:
   updating one or more operating parameters of a gate driver responsive to an update request during an operating mode of the gate driver in which switching operations occur, the one or more operating parameters being updated including one or more turn-on parameters, one or more turn-off parameters, or both the one or more turn-on parameters and the one or more turn-off parameters, the turn-on parameters and the turn-off parameters associated with supplying an output signal supplied by the gate driver to drive a device,
   using the turn-on parameters for a first plurality of turn-on phases for an output signal that is coupled to the device that is driven by the gate driver;
   using the turn-off parameters for a second plurality of turn-off phases for the output signal;
   writing configuration registers during a configuration mode of the gate driver with first data received from a host controller;
   preventing writing to the configuration registers by the host controller during the operating mode of the gate driver;
   writing one or more operating registers during the configuration mode with second data received from the host controller; and writing at least some of the operating registers with third data received from the host controller during the operating mode.

8. The method of claim 7, further comprising:
periodically performing during the operating mode a first cyclic redundancy check cyclic redundancy check operation on the configuration registers and supplying a generated configuration cyclic redundancy check;
comparing the generated configuration cyclic redundancy check to a stored configuration cyclic redundancy check to determine if the configuration registers have an error;
periodically performing during the operating mode a second cyclic redundancy check operation on the operating registers and generating a generated operating registers cyclic redundancy check; and
comparing the generated operating registers cyclic redundancy check to a stored operating registers cyclic redundancy check to determine if the operating registers have an error.

9. The method of claim 7 wherein the operating registers include profile component registers containing pointers to entries in one of more value tables containing values for current, time, and voltage and wherein the operating registers include an active profile register containing a pointer to a profile specifying indirectly current, time, and voltage for each stage of the first plurality of turn-on phases and the second plurality of turn-off phases.

10. The method of claim 9 wherein the operating registers include soft shut down working registers containing values for current, time, and voltage.

11. The method of claim 7 wherein the updating includes selecting one of a plurality of profiles as the update request, each of the profiles specifying current, voltage, and time parameters for each phase of the first plurality of turn-on phases and for each phase of the second plurality of turn-off phases.

12. A gate driver comprising:
a variable strength driver circuit configured to provide an output signal to an output node, the gate driver responsive to an update request from a host controller during an operating mode in which switching operations occur, to update one or more turn-on parameters, one or more turn-off parameters, or both the one or more turn-on parameters and the one or more turn-off parameters, the turn-on parameters and the turn-off parameters associated with supplying the output signal supplied by the gate driver, the gate driver configured to use the turn-on parameters for a first plurality of turn-on phases for the output signal the gate driver configured to use the turn-off parameters for a second plurality of turn-off phases for the output signal; and
storage locations in the gate driver storing the turn-on parameters and the turn-off parameters, one or more of the storage locations being updated responsive to the update request, the storage locations storing a plurality of profiles, each of the profiles specifying current, voltage, and time for each phase of the first plurality of turn-on phases and for each phase of the second plurality of turn-off phases, and the update request requesting that a different one of the plurality of profiles be used instead of a current one of the plurality of profiles.

13. The gate driver of claim 12 wherein the gate driver is responsive to another update request during the operating mode, to update one or more soft shut down parameters, the soft shut down parameters being for a third plurality of soft shutdown phases for shutting down the gate driver.

14. The gate driver of claim 12, further comprising one or more pins on a first die on an input side of the gate driver, signals on the one or more pins selecting the different one of the plurality of profiles.

15. The gate driver of claim 12 wherein the storage locations further include:
configuration registers that are writable by a host controller during a configuration mode of the gate driver, the configuration registers not writable by the host controller during the operating mode;
operating registers that are writable by the host controller during the configuration mode, the operating registers writable by the host controller during the operating mode, the operating registers including turn-on working registers and turn-off working registers, the turn-on working registers and turn-off working registers containing values for current, time, and voltage for the first plurality of turn-on phases and the second plurality of turn-off phases, and the operating registers including an active profile register containing a pointer to a profile specifying current, time, and voltage for each stage of the first plurality of turn-on phases and the second plurality of turn-off phases.

16. The gate driver of claim 15, further comprising:
cyclic redundancy check logic to periodically perform during the operating mode a cyclic redundancy check operation on the configuration registers and supply a generated configuration cyclic redundancy check, the generated configuration cyclic redundancy check being compared to a stored configuration cyclic redundancy check to determine if the configuration registers have an error, the cyclic redundancy check logic to perform during the operating mode a second cyclic redundancy check operation on the operating registers and supplying a generated operating registers cyclic redundancy check, and the generated operating registers cyclic redundancy check being compared to a stored operating registers cyclic redundancy check to determine if the operating registers have an error.

17. The gate driver of claim 15 wherein the operating registers include soft shut down working registers containing values for current, time, and voltage for a third plurality of turn-off phases for soft shutdown.

18. The gate driver of claim 15 wherein the storage locations include a storage location configurable during a configuration mode to specify whether to use bus control or pin control for access to the operating registers during the operating mode.

19. The gate driver of claim 15, further comprising a control pin on a first integrated die to specify using default configuration values for the configuration registers and for the operating registers and to use pin control to select one of a plurality of default profiles during the operating mode and to enter the operating mode responsive to the configuration registers having been written from values stored in non-volatile memory.

20. The gate driver of claim 12 wherein the gate driver is configured to synchronize the updating of the turn-on parameters and the turn-off parameters with turn-on and turn-off of the output signal, the turn-on and turn-off being controlled according to a pulse wave modulated signal received by the gate driver from a host controller, the gate driver is configured to synchronize changes to any of the turn-on parameters requested by the update request to the gate driver responsive to a switching state of the gate driver changing from an on-state to an off-state, and the gate driver is configured to synchronize changes to any of the turn-off parameters requested by the update request to the gate driver responsive to the switching state of the gate driver changing from the off-state to the on-state.

21. A gate driver comprising:
- a variable strength driver circuit configured to provide an output signal to an output node, the gate driver responsive to an update request from a controller separate from the gate driver during an operating mode in which switching operations occur, to update one or more operating parameters, the operating parameters including turn-on parameters, turn-off parameters, and soft shutdown parameters, the gate driver configured to use the turn-on parameters for a first plurality of turn-on phases for the output signal, the gate driver configured to use the turn-off parameters for a second plurality of turn-off phases for the output signal, the gate driver configured to use the soft shutdown parameters for a third plurality soft shutdown phases for the output signal;
- storage locations in the gate driver storing the turn-on parameters, the turn-off parameters, and the soft shutdown parameters, one or more of the storage locations being updated responsive to the update request, the storage locations including, profile component registers containing pointers to parameter value look up tables for the turn-on phases, the turn-off phases, and the soft shutdown phases; and
- working registers coupled to the parameter values look up tables, the working registers storing currently selected values of the turn-on parameters, the turn-off parameters, and the soft shutdown parameters for use by the variable strength driver circuit.

* * * * *

UNITED STATES PATENT AND TRADEMARK OFFICE
CERTIFICATE OF CORRECTION

PATENT NO. : 12,155,332 B2
APPLICATION NO. : 17/219321
DATED : November 26, 2024
INVENTOR(S) : James Edward Heckroth Page 1 of 2

It is certified that error appears in the above-identified patent and that said Letters Patent is hereby corrected as shown below:

In the Specification

Column 9, Line 47, delete "current IGATE, which" and insert -- current $I_{GATE}$, which --.

Column 9, Line 49, delete "voltage VDS, drain current ID," and insert -- voltage $V_{DS}$, drain current $I_D$, --.

Column 9, Line 55, delete "current IGATE flowing" and insert -- current $I_{GATE}$ flowing --.

Column 9, Line 56, delete "current ID of" and insert -- current $I_D$ of --.

Column 9, Line 58, delete "voltage VDS and" and insert -- voltage $V_{DS}$ and --.

Column 10, Line 40, delete "$t_{ON2}$ Specifies the" and insert -- $t_{ON2}$ specifies the --.

Column 10, Line 48, delete "current ID increases" and insert -- current $I_D$ increases --.

Column 11, Line 2, delete "(i.e., $I_{MC\_SET}$ $I_{OFF1\_SET}$ and" and insert -- (i.e., $I_{MC\_SET} \geq I_{OFF1\_SET}$ and --.

Column 11, Line 48, delete "voltage VDS (or" and insert -- voltage $V_{DS}$ (or --.

Column 11, Line 62, delete "voltage VDS (or" and insert -- voltage $V_{DS}$ (or --.

Column 12, Line 57, delete "current IGATE, provided" and insert -- current $I_{GATE}$, provided --.

Column 13, Line 15, delete "$S_{ON\_Pn}$ Of current" and insert -- $S_{ON\_Pn}$ of current --.

Column 13, Line 51, delete "capacitor CHF and reservoir capacitor CLF coupled" and insert -- capacitor $C_{HF}$ and reservoir capacitor $C_{LF}$ coupled --.

Signed and Sealed this
Fifteenth Day of April, 2025

Coke Morgan Stewart
*Acting Director of the United States Patent and Trademark Office*

Column 16, Line 65, delete "voltage VDS and" and insert -- voltage $V_{DS}$ and --.

In the Claims

Column 26, Line 20, Claim 4, delete "The method, as recited in claim 1" and insert -- The method of claim 1 --.

Column 26, Line 43, Claim 7, delete "The method" and insert -- A method --.

Column 27, Line 6, Claim 8, delete "first cyclic redundancy check cyclic redundancy check operation" and insert -- first cyclic redundancy check operation --.